United States Patent [19]
Murakami et al.

[11] Patent Number: 5,751,404
[45] Date of Patent: May 12, 1998

[54] EXPOSURE APPARATUS AND METHOD WHEREIN ALIGNMENT IS CARRIED OUT BY COMPARING MARKS WHICH ARE INCIDENT ON BOTH RETICLE STAGE AND WAFER STAGE REFERENCE PLATES

[75] Inventors: Eiichi Murakami; Fumio Sakai, both of Utsunomiya; Shigeyuki Uzawa, Nakamachi; Shigeki Ogawa, Minaminasumachi; Tetsuya Mori, Utsunimiya, all of Japan

[73] Assignee: Canon Kabushiki Kaisha, Tokyo, Japan

[21] Appl. No.: 684,100

[22] Filed: Jul. 22, 1996

[30] Foreign Application Priority Data

| Jul. 24, 1995 | [JP] | Japan | 7-187171 |
| May 8, 1996 | [JP] | Japan | 8-113542 |
| Jul. 9, 1996 | [JP] | Japan | 8-179083 |

[51] Int. Cl.$^6$ ............ G03B 27/42; G03B 27/52; G03B 27/32; G02B 11/00
[52] U.S. Cl. .................. 355/53; 355/55; 355/77; 356/401; 250/201.1
[58] Field of Search .................. 356/399, 400, 356/401; 250/201.1, 548, 559.3, 559; 355/53, 50, 55, 72, 73

[56] References Cited

U.S. PATENT DOCUMENTS

| 4,414,749 | 11/1983 | Johannsmeier | 33/18 RO |
| 5,112,133 | 5/1992 | Kurosawa et al. | 356/401 |
| 5,142,156 | 8/1992 | Ozawa et al. | 250/548 |
| 5,168,306 | 12/1992 | Morimoto et al. | 355/53 |
| 5,182,615 | 1/1993 | Kurosawa et al. | 356/400 |
| 5,194,893 | 3/1993 | Nishi | 355/53 |
| 5,243,195 | 9/1993 | Nishi | 250/548 |
| 5,309,197 | 5/1994 | Mori et al. | 355/53 |
| 5,414,514 | 5/1995 | Smith et al. | 356/401 X |
| 5,498,878 | 3/1996 | Hasegawa et al. | 250/548 |
| 5,499,099 | 3/1996 | Sato et al. | 356/400 |

FOREIGN PATENT DOCUMENTS

| 0 613 051 A1 | 8/1994 | European Pat. Off. . |
| 8-264427 | 10/1996 | Japan . |

*Primary Examiner*—R. L. Moses
*Assistant Examiner*—Shival Virmani
*Attorney, Agent, or Firm*—Fitzpatrickm Cella, Harper & Scinto

[57] ABSTRACT

A scanning exposure apparatus includes a first movable stage being movable while carrying a first object thereon, a second movable stage being movable while carrying a second object thereon, a projection optical system for projecting a pattern, a control system serviceable to scan the first and second movable stages in a timed relation and relative to the projection optical system and to project a pattern of the first object onto the second object through the projection optical system, a first reference plate fixedly mounted on the first movable stage, a second reference plate fixedly mounted on the second movable stage, and a detecting system serviceable to scan at least one of the first and second movable stages to detect a relative positional relationship between alignment marks of the first and second reference plates to thereby determine a scan direction of one of the first and second movable stages.

29 Claims, 22 Drawing Sheets

(a)
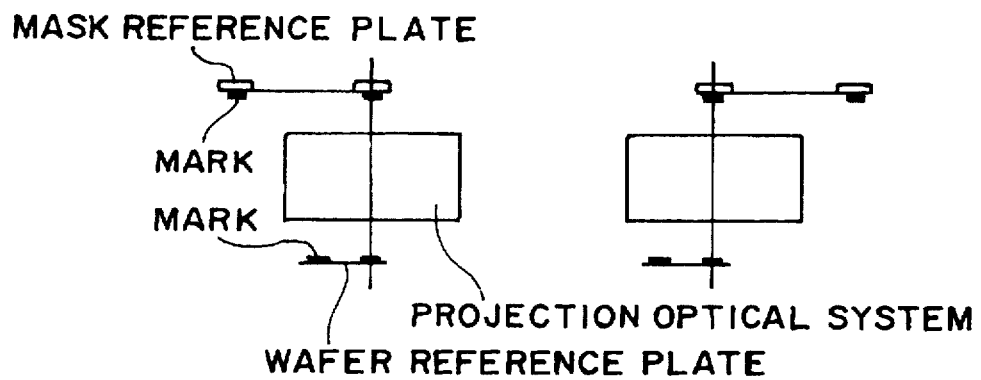
(b)
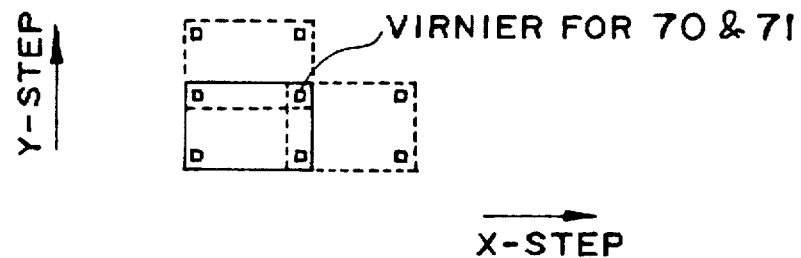
(c)
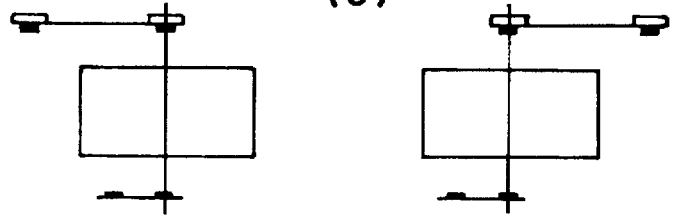
(d)
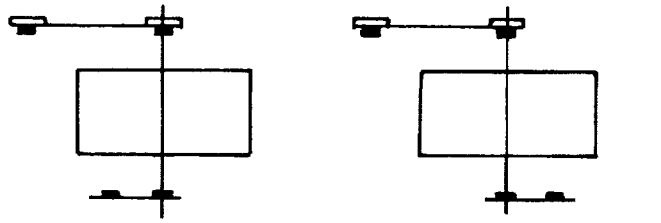
(e)
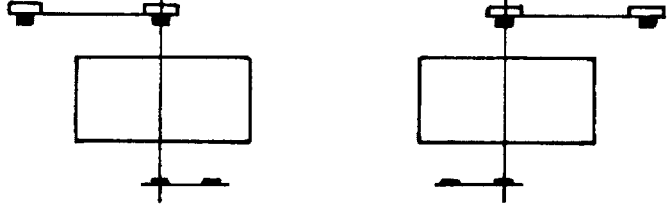
F I G. 4

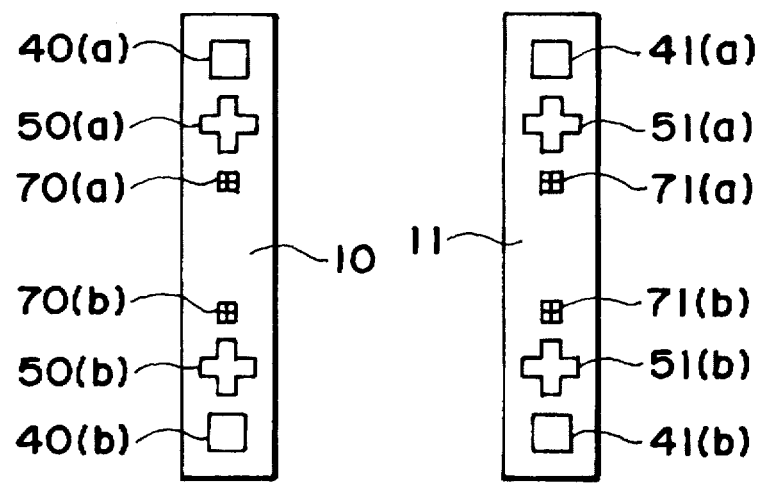
F I G. 5
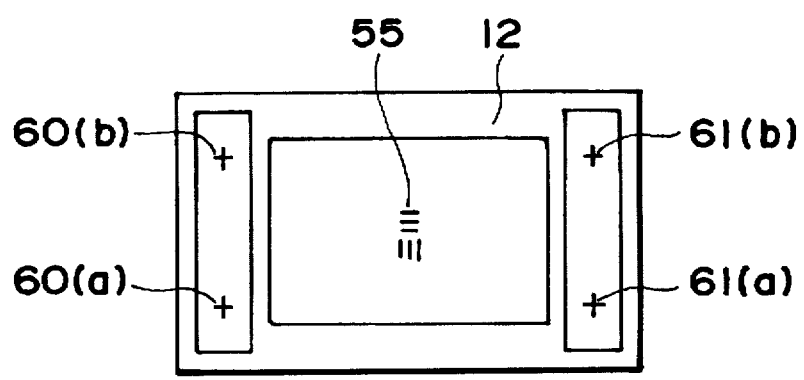
F I G. 6

(a)
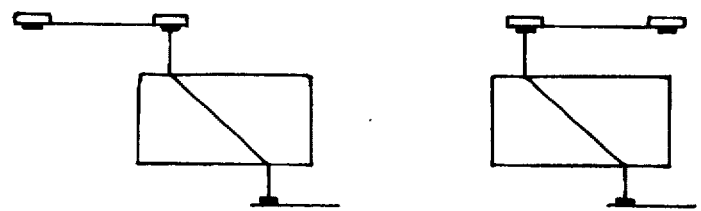
(b)
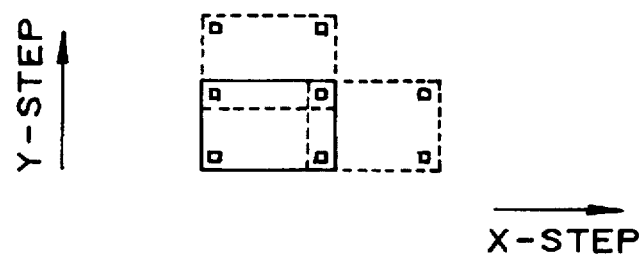
X-STEP
(c)
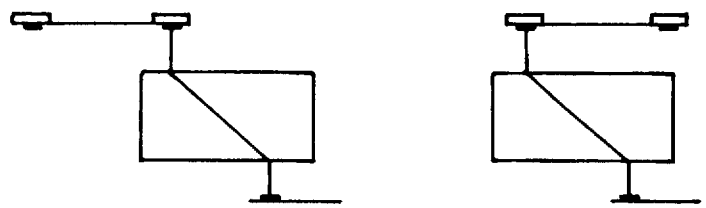
(d)
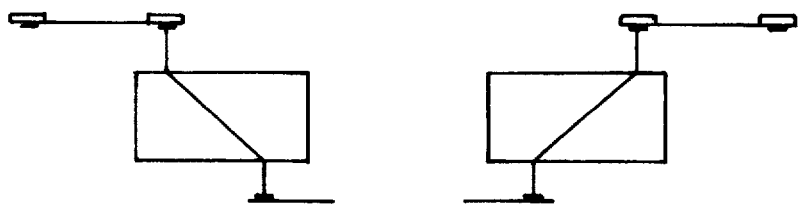
FIG. 9

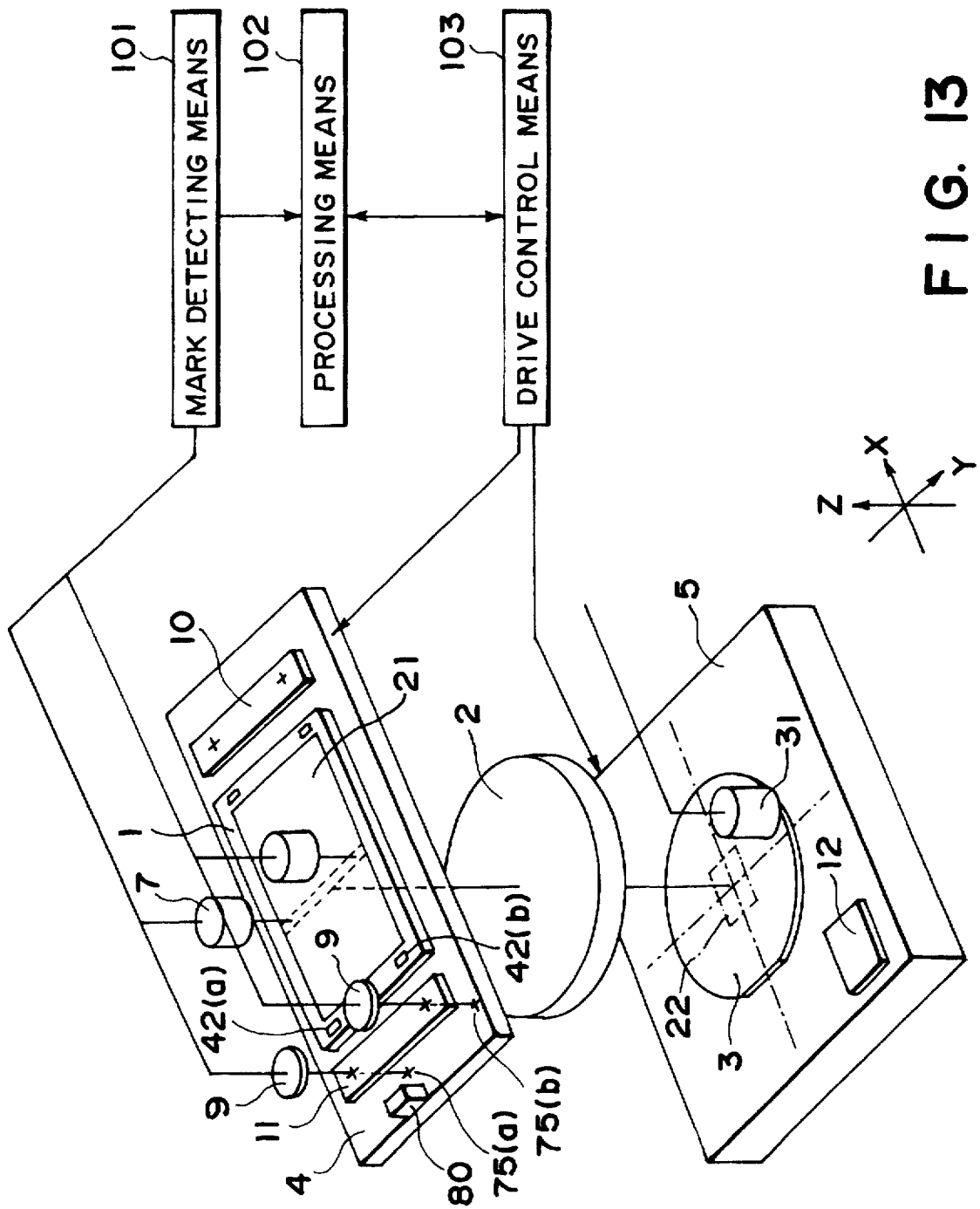
F I G. 13

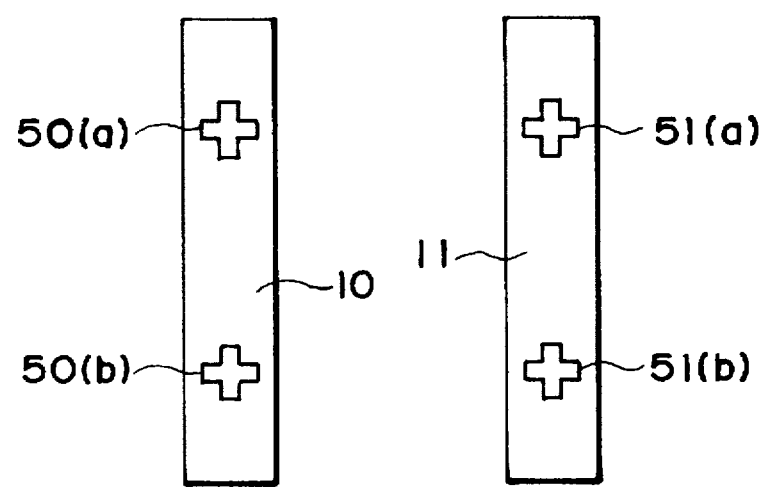
F I G. 14

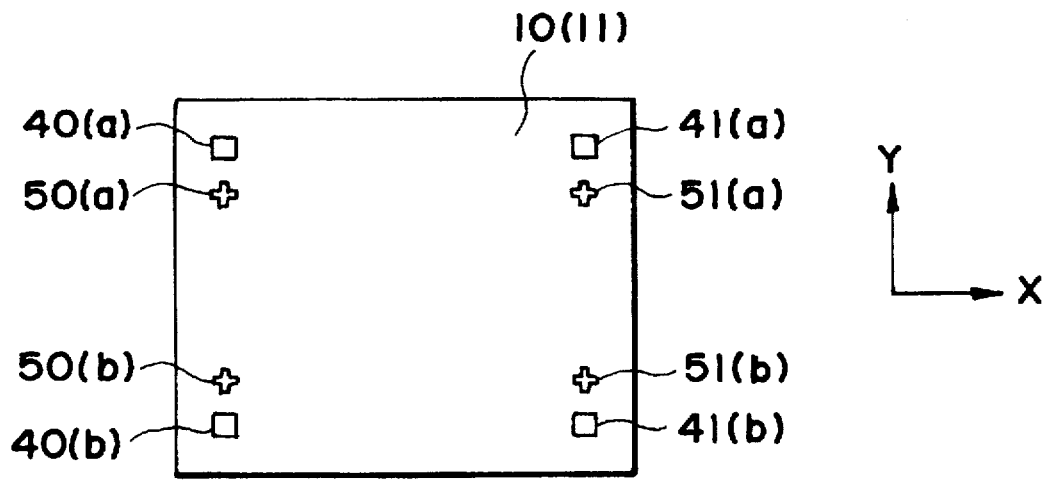
F I G. 19
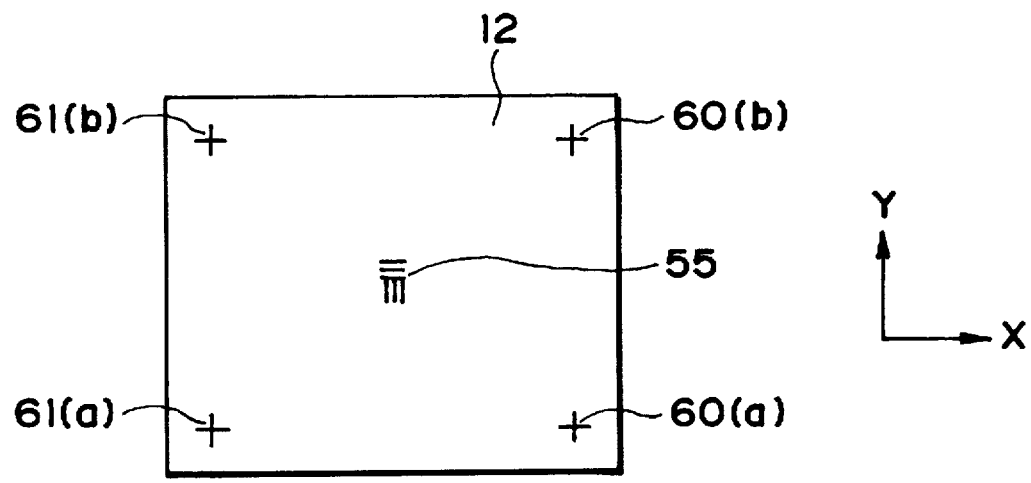
F I G. 20

EXPOSURE APPARATUS AND METHOD WHEREIN ALIGNMENT IS CARRIED OUT BY COMPARING MARKS WHICH ARE INCIDENT ON BOTH RETICLE STAGE AND WAFER STAGE REFERENCE PLATES

FIELD OF THE INVENTION AND RELATED ART

This invention relates to an exposure apparatus usable in a semiconductor device manufacturing process and, more particularly, to a projection exposure apparatus for projecting a photomask pattern on a wafer. The invention is suitably applicable, for example, to a scanning exposure apparatus or method wherein, during projection of a photomask pattern on a wafer for exposure thereof, the mask and wafer are scanningly moved in a timed relation relative to a projection optical system.

Semiconductor device technology has been advanced considerably, and micro-processing technology has also been advanced notably. Particularly, in photo-processing technology, reduction projection type exposure apparatuses, called "steppers", having a resolution of submicron order are used prevalently. For further enhancement of resolution, enlargement of numerical aperture of an optical system or reduction in wavelength of exposure light have been attempted.

On the other hand, attempts have been made to modify a conventional unit-magnification scan exposure apparatus having a reflection projection optical system to incorporate a refracting element into a projection optical system, such that reflecting elements and refracting elements are used in combination. Other attempts have been made to use a reduction projection optical system consisting only of refracting elements and to move both of a mask stage and a stage (wafer stage) for a photosensitive substrate in a speed ratio corresponding to the reduction magnification.

FIG. 1 illustrates an example of such scanning exposure apparatus. Mask 1 having an original pattern is supported by a mask stage 4, and a wafer (photosensitive substrate) 3 is supported by a wafer stage 5. The mask 1 and the wafer 3 are disposed at positions which are in an optically conjugate relation with each other with respect to a projection optical system 2. Slit-like exposure light 6 from an illumination optical system (not shown), extending in Y direction illustrated, illuminates the mask 6 such that it is imaged on the wafer 3 in a size corresponding to the projection magnification of the projection exposure system 2. Scan exposure is performed by moving both the mask stage 4 and the wafer stage 5 relative to the slit-like exposure light 6, that is, to the projection optical system 2 at a speed ratio corresponding to the optical magnification. By this, the mask 1 and the wafer 3 are scanned, such that the whole of device pattern 21 on the mask 3 is transferred to a transfer region on the wafer 3.

For scanning exposure, the scan has to be done while taking accurate registration of the mask 1 and the wafer 3 continuously. To this end, the following points should be satisfied:

1) Axial alignment and registration (position alignment) between the mask stage and the wafer stage; and
2) Detection of distance (base line correction) between the alignment position and the pattern drawing position.

Conventionally, the following procedure is taken. That is, as shown in FIG. 1, plural alignment marks 41 are formed on the mask 1, and plural alignment marks 42 are formed at corresponding positions on the wafer stage. The stages are moved and, at respective positions, alignment marks of the mask and the wafer are observed through an observation microscope 7 to measure a positional error between the mask and the wafer stage. On the basis of this measurement, correction is done so as to assure alignment of the run of the wafer stage with the run of the mask.

After the mask to wafer stage alignment, the distance between the pattern drawing center position and the detecting position of an alignment detection system, on the basis of which the base line correction is performed.

Here, as regards the mask, it is desirable, in the point of precision, to prepare and use one and the same reference mask in order to avoid patterning errors between different masks. However, using such reference mask involves problems such as follows:

a) A reference mask has to be loaded into the apparatus periodically or when lots are changed. This affects the throughput; and
b) Mask handling becomes cumbersome.

In consideration of the above, alignment marks may be formed upon a product mask. However, it raises problems such as follows:

a) It needs an exclusive area for plural marks; and
b) Each time a mask is loaded into the apparatus, corrections described in Items 1) and 2) has to be performed. This affects the throughput.

SUMMARY OF THE INVENTION

In accordance with an aspect of the present invention, there is provided a scanning exposure apparatus, comprising: a first movable stage being movable while carrying a first object thereon; a second movable stage being movable while carrying a second object thereon; a projection optical system for projecting a pattern; control means serviceable to scan said first and second movable stages in a timed relation and relative to said projection optical system and to project a pattern of the first object onto the second object through said projection optical system; a first reference plate fixedly mounted on said first movable stage; a second reference plate fixedly mounted on said second movable stage; and detecting means serviceable to scan at least one of said first and second movable stages to detect a relative positional relationship between alignment marks of said first and second reference plates to thereby determine a scan direction of one of said first and second movable stages.

At least one of said first and second reference plates may comprise plural alignment marks arrayed along the scan direction.

Said detecting means may comprise observing means for observing one of the alignment marks through said projection optical system.

The first object may have an alignment mark formed thereon, and wherein said apparatus may further comprise means for detecting a relative positional relationship between the alignment mark of the first object and the alignment mark of said reference plate.

In accordance with another aspect of the present invention, there is provided a scanning exposure method wherein a first movable stage being movable while carrying a first object thereon and a second movable stage being movable while carrying a second object thereon are scanned in a timed relation and relative to a projection optical system and wherein a pattern of one of the first and second objects is projected onto the other through the projection optical system, said method comprising: a first detecting step for detecting a relative positional relationship between a first alignment mark of a first reference plate fixedly mounted on the first movable stage and a predetermined alignment mark of a second reference plate fixedly mounted on the second movable stage; a second detecting step for moving the first movable stage in a scan exposure direction and for detecting a relative positional relationship between the predetermined alignment mark of the second reference plate and a second alignment mark of the first reference plate which second alignment mark is disposed in the scan exposure direction, with respect to the first alignment mark; and a determining step for determining a scan direction of one of the first and second movable stages on the basis of the detection at said first and second detecting steps.

The first object may have the pattern formed thereon, and wherein said method may further comprise a third detecting step for detecting a relative positional relationship between the alignment mark of the first object and at least one of the first and second alignment marks of the first reference plate.

The method may further comprise an aligning step for aligning a scan direction of the first object with a scan direction of the first movable stage on the basis of the detection at said first, second and third detecting steps.

In accordance with a further aspect of the present invention, there is provided a scanning exposure apparatus, comprising: a first movable stage being movable while carrying a first object thereon; a second movable stage being movable while carrying a second object thereon; a projection optical system for projecting a pattern; control means serviceable to scan said first and second movable stages in a timed relation and relative to said projection optical system and to project a pattern of the first object onto the second object through said projection optical system; a first reference plate fixedly mounted on said first movable stage; a second reference plate fixedly mounted on a holding member for holding said projection optical system; and detecting means serviceable to scan said first movable stage to detect a relative positional relationship between alignment marks of said first and second reference plates to thereby determine a scan direction of said first movable stage.

Said first reference plate may comprise plural alignment marks arrayed along the scan direction.

In accordance with a yet further aspect of the present invention, there is provided a scanning exposure method wherein a first movable stage being movable while carrying a first object thereon and a second movable stage being movable while carrying a second object thereon are scanned in a timed relation and relative to a projection optical system and wherein a pattern of the first object is projected onto the second object through the projection optical system, said method comprising: a first detecting step for detecting a relative positional relationship between a first alignment mark of a first reference plate fixedly mounted on the first movable stage and a predetermined alignment mark of a second reference plate fixedly mounted on a holding plate for holding the projection optical system; a second detecting step for moving the first movable stage in a scan exposure direction and for detecting a relative positional relationship between the predetermined alignment mark of the second reference plate and a second alignment mark of the first reference plate which second alignment mark is disposed in the scan exposure direction, with respect to the first alignment mark; and a determining step for determining a scan direction of one of the first and second movable stages on the basis of the detection at said first and second detecting steps.

The first object may have an alignment mark formed thereon, and wherein said method may further comprise a third detecting step for detecting a relative positional relationship between the alignment mark of the first object and at least one of the first and second alignment marks of the first reference plate and the predetermined alignment mark of the second reference plate.

In accordance with a still further aspect of the present invention, there is provided a device manufacturing method wherein a first movable stage being movable while carrying a mask thereon and a second movable stage being movable while carrying a wafer thereon are scanned in a timed relation and relative to a projection optical system and wherein a pattern of the mask is projected and printed onto the wafer through the projection optical system, from which wafer devices are manufactured, said method comprising: a first detecting step for detecting a relative positional relationship between a first alignment mark of a first reference plate fixedly mounted on the first movable stage and a predetermined alignment mark of a second reference plate fixedly mounted on the second movable stage; a second detecting step for moving the first movable stage in a scan exposure direction and for detecting a relative positional relationship between the predetermined alignment mark of the second reference plate and a second alignment mark of the first reference plate which second alignment mark is disposed in the scan exposure direction, with respect to the first alignment mark; and a determining step for determining a scan direction of one of the first and second movable stages on the basis of the detection at said first and second detecting steps.

In accordance with a yet further aspect of the present invention, there is provided a device manufacturing method wherein a first movable stage being movable while carrying a mask thereon and a second movable stage being movable while carrying a wafer thereon are scanned in a timed relation and relative to a projection optical system and wherein a pattern of the mask is projected and printed onto the wafer through the projection optical system, from which wafer devices are manufactured, said method comprising: a first detecting step for detecting a relative positional relationship between a first alignment mark of a first reference plate fixedly mounted on the first movable stage and a predetermined alignment mark of a second reference plate fixedly mounted on a holding member for holding the projection optical system; a second detecting step for moving the first movable stage in a scan exposure direction and for detecting a relative positional relationship between the predetermined alignment mark of the second reference plate and a second alignment mark of the first reference plate which second alignment mark is disposed in the scan exposure direction, with respect to the first alignment mark; and a determining step for determining a scan direction of one of the first and second movable stages on the basis of the detection at said first and second detecting steps.

In accordance with a yet further aspect of the present invention, there is provided a scanning exposure method usable with a first movable stage being movable while carrying a first object thereon, a second movable stage being movable while carrying a second object thereon, a first reference plate fixedly mounted on the first movable stage and having plural alignment marks formed thereon, and a second reference plate fixedly mounted on the second movable stage and having plural alignment marks formed thereon, wherein the first and second movable stages are scanned in a timed relation and relative to a projection optical system, and wherein a pattern of the first object is projected onto the second object through the projection optical system, said method comprising: a first detecting step for detecting a relative positional relationship between alignment marks of the first reference plate and alignment marks of the second reference plate through the projection optical system to detect a relationship between a coordinate system as determined by plural alignment marks of the first reference plate and a coordinate system as determined by plural alignment marks of the second reference plate; a second detecting step for moving the first movable stage in a scan exposure direction to detect positions of alignment marks of the first reference plate and for detecting a relationship between a coordinate system as determined by alignment marks of the second reference plate and a coordinate system as determined by an actual scan direction of the first movable stage; a third detecting step for moving the second movable stage in a scan exposure direction to detect positions of alignment marks of the second reference plate and for detecting a relationship between a coordinate system as determined by alignment marks of the second reference plate and a coordinate system as determined by an actual scan direction of the second movable stage; and a determining step for determining a relationship between the actual scan direction of the first movable stage and the actual scan direction of the second movable stage on the basis of the detection at said first, second and third detecting steps.

The method may further comprise a fourth detecting step for detecting a relative positional relationship between alignment marks of the first object and alignment marks of the first reference plate and for detecting a relationship between a coordinate system as determined by alignment marks of the first reference plate and a coordinate system as determined by alignment marks of the first object.

The method may further comprise a correcting step for correcting the scan direction of the first movable stage on the basis of the detection at said fourth detecting step.

The method may further comprise (i) a fifth detecting step for detecting a relative positional relationship between alignment marks of the first reference plate and alignment marks of a third reference plate fixedly mounted no a holding member for holding the projection optical system and for detecting a relationship between a coordinate system as determined by alignment marks of the first reference plate and alignment marks of the third reference plate, and (ii) a sixth detecting step for detecting a relative positional relationship between alignment mark of the first object and alignment marks of the third reference plate and for detecting a relationship between a coordinate system as determined by alignment marks of the first reference plate and a coordinate system as determined by alignment marks of the third reference plate.

The method may further comprise a correcting step for correcting the scan direction of the first movable state on the basis of the detection at said sixth detecting step.

The method may further comprises a correcting step for correcting a scan direction of at least one of the first and second movable stages on the basis of the relationship between the actual movement direction of the first movable stage and the actual movement direction of the second movable stage.

In accordance with a yet further aspect of the present invention, there is provided a device manufacturing method usable with a first movable stage being movable while carrying a mask thereon, a second movable stage being movable while carrying a wafer thereon, a first reference plate fixedly mounted on the first movable stage and having plural alignment marks formed thereon, and a second reference plate fixedly mounted on the second movable stage and having plural alignment marks formed thereon, wherein the first and second movable stages are scanned in a timed relation and relative to a projection optical system, and wherein a pattern of the mask is projected onto the wafer through the projection optical system, from which wafer devices are manufactured, said method comprising: a first detecting step for detecting a relative positional relationship between alignment marks of the first reference plate and alignment marks of the second reference plate through the projection optical system to detect a relationship between a coordinate system as determined by plural alignment marks of the first reference plate and a coordinate system as determined by plural alignment marks of the second reference plate; a second detecting step for moving the first movable stage in a scan exposure direction to detect positions of alignment marks of the first reference plate and for detecting a relationship between a coordinate system as determined by alignment marks of the second reference plate and a coordinate system as determined by an actual scan direction of the first movable stage; a third detecting step for moving the second movable stage in a scan exposure direction to detect positions of alignment marks of the second reference plate and for detecting a relationship between a coordinate system as determined by alignment marks of the second reference plate and a coordinate system as determined by an actual scan direction of the second movable stage; and a determining step for determining a relationship between the actual scan direction of the first movable stage and the actual scan direction of the second movable stage on the basis of the detection at said first, second and third detecting steps.

In accordance with a yet further aspect of the present invention, there is provided a scanning exposure apparatus, comprising: a first movable stage being movable while carrying a first object thereon; a second movable stage being movable while carrying a second object thereon; an illumination optical system for illuminating the first object with exposure light; a projection optical system for projecting a pattern of the first object as illuminated by said illumination optical system; control means serviceable to scan said first and second movable stages in a timed relation and relative to said projection optical system and to project the pattern of the first object onto the second object through said projection optical system; first detecting means for detecting a relative positional relationship between an alignment mark of a first reference plate fixedly mounted on said first movable stage and an alignment mark of a second reference plate fixedly mounted on said second movable stage; second detecting means for detecting a position of said second reference plate in cooperation with said projection optical system; and third detecting means for detecting a measurement error in the detection of a position of the second object through said second detecting means, on the basis of the detection by said first and second detecting means.

Said first detecting means may use measurement light having a wavelength substantially the same as that of the exposure light.

Said second detecting means may use measurement light having a wavelength substantially the same as that of the exposure light.

All the detecting means and the alignment marks may be so arranged that, when said first detecting means detects the relative positional relationship between the first and second reference plates, said second detecting means measures a position of the second reference plate without moving said first and second movable stages.

In accordance with a yet further aspect of the present invention, there is provided a scanning exposure method usable with a first movable stage being movable while carrying a first object thereon, a second movable stage being movable while carrying a second object thereon, an illumination optical system for illuminating the first object with exposure light, and a projection optical system for projecting a pattern of the first object illuminated by the illumination optical system onto the second object, wherein the first and second movable stages are scanned in a timed relation and relative to the projection optical system, and wherein the pattern of the first object is projected onto the second object through the projection optical system, said method comprising: a first detecting step for detecting a relative positional relationship between an alignment mark of a first reference plate fixedly mounted on the first movable stage and an alignment mark of a second reference plate fixedly mounted on the second movable stage; a second detecting step for detecting a position of the second reference plate through the projection optical system; and a third detecting step for detecting a measurement error in the detection of the position of the second object by the second detecting means, on the basis of the detection at said first and second detecting steps.

Said first detecting step may use measurement light having a wavelength substantially the same as that of the exposure light.

Said second detecting step may use measurement light having a wavelength substantially the same as that of the exposure light.

When the relative positional relationship between the first and second reference plates is detected at said first detecting step, a position of the second reference plate may be measured without moving the first and second movable stages.

In accordance with a yet further aspect of the present invention, there is provided a device manufacturing method usable with a first movable stage being movable while carrying a mask thereon, a second movable stage being movable while carrying a wafer thereon, an illumination optical system for illuminating the mask with exposure light, and a projection optical system for projecting a pattern of the mask illuminated by the illumination optical system onto the wafer, wherein the first and second movable stages are scanned in a timed relation and relative to the projection optical system, and wherein the pattern of the mask is projected onto the wafer through the projection optical system, from which wafer devices are manufactured, said method comprising: a first detecting step for detecting a relative positional relationship between an alignment mark of a first reference plate fixedly mounted on the first movable stage and an alignment mark of a second reference plate fixedly mounted on the second movable stage; a second detecting step for detecting a position of the second reference plate through the projection optical system; and a third detecting step for detecting a measurement error in the detection of a position of the wafer through the projection optical system, on the basis of the detection at said first and second detecting steps.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 4(a) through 4(b) are schematic views is a schematic view for explaining details of the operation in the flow chart of FIG. 3.

FIG. 5 is a schematic view of a mask reference plate used in the first embodiment.

FIG. 6 is a schematic view of a wafer reference plate used in the first embodiment.

FIG. 9(a) through 9(d) are schematic views is a schematic view for explaining details of the operation in the flow chart of FIG. 8.

FIG. 13 is a schematic view of a main portion of a scanning exposure apparatus according to a fourth embodiment of the present invention.

FIG. 14 is a schematic view of a reference plated used in the fourth embodiment.

FIG. 19 is a schematic view of a mask reference plate used in the fifth embodiment of the present invention.

FIG. 20 is a schematic view of a wafer reference plate used in the fifth embodiment of the present invention.

DESCRIPTION OF THE PREFERRED EMBODIMENTS

Figure 1:
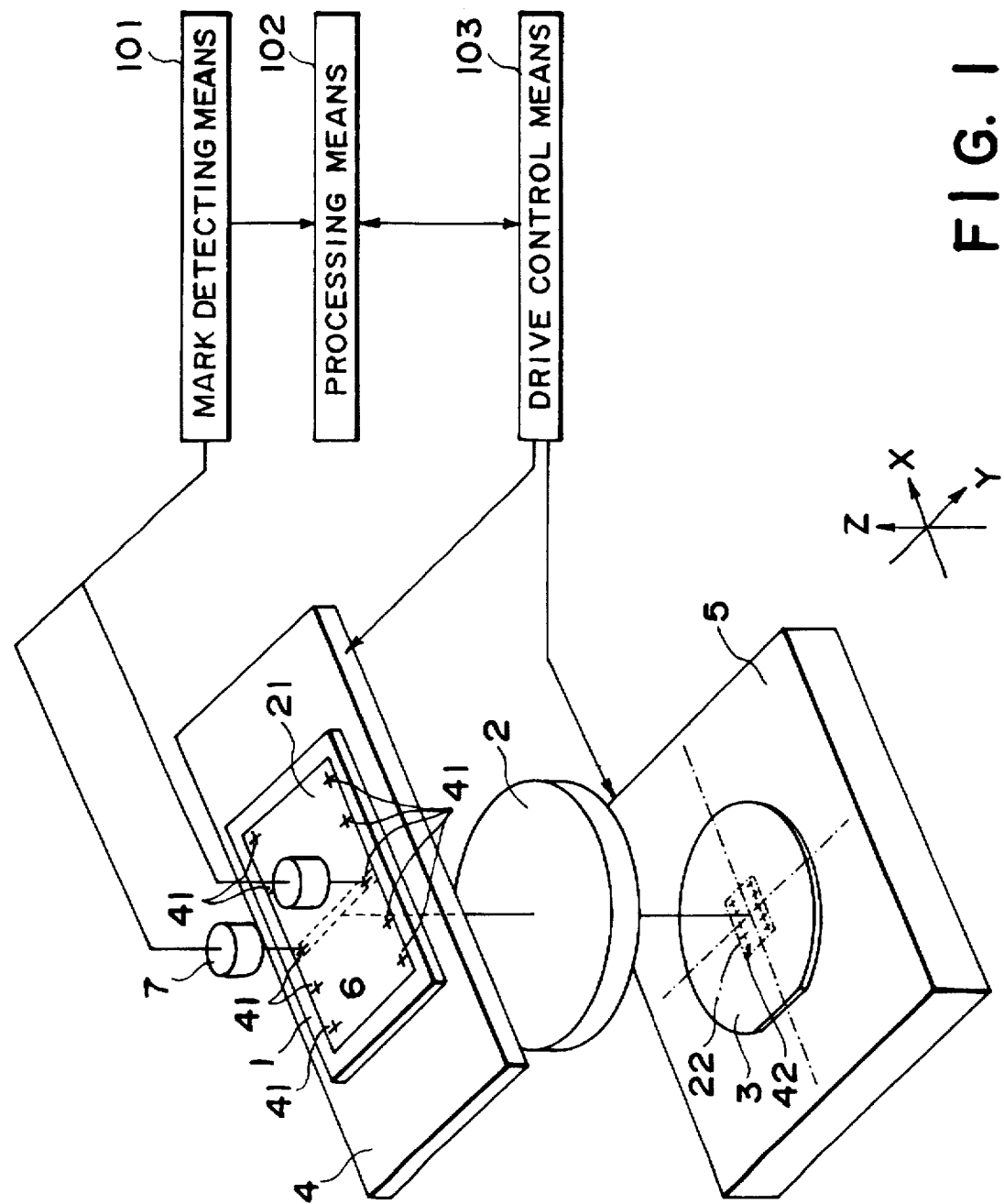
FIG. 1 is a schematic view of a known type scanning exposure apparatus.

The invention will be described with reference to preferred embodiments shown in the drawings.

[Embodiment 1]

Figure 2:
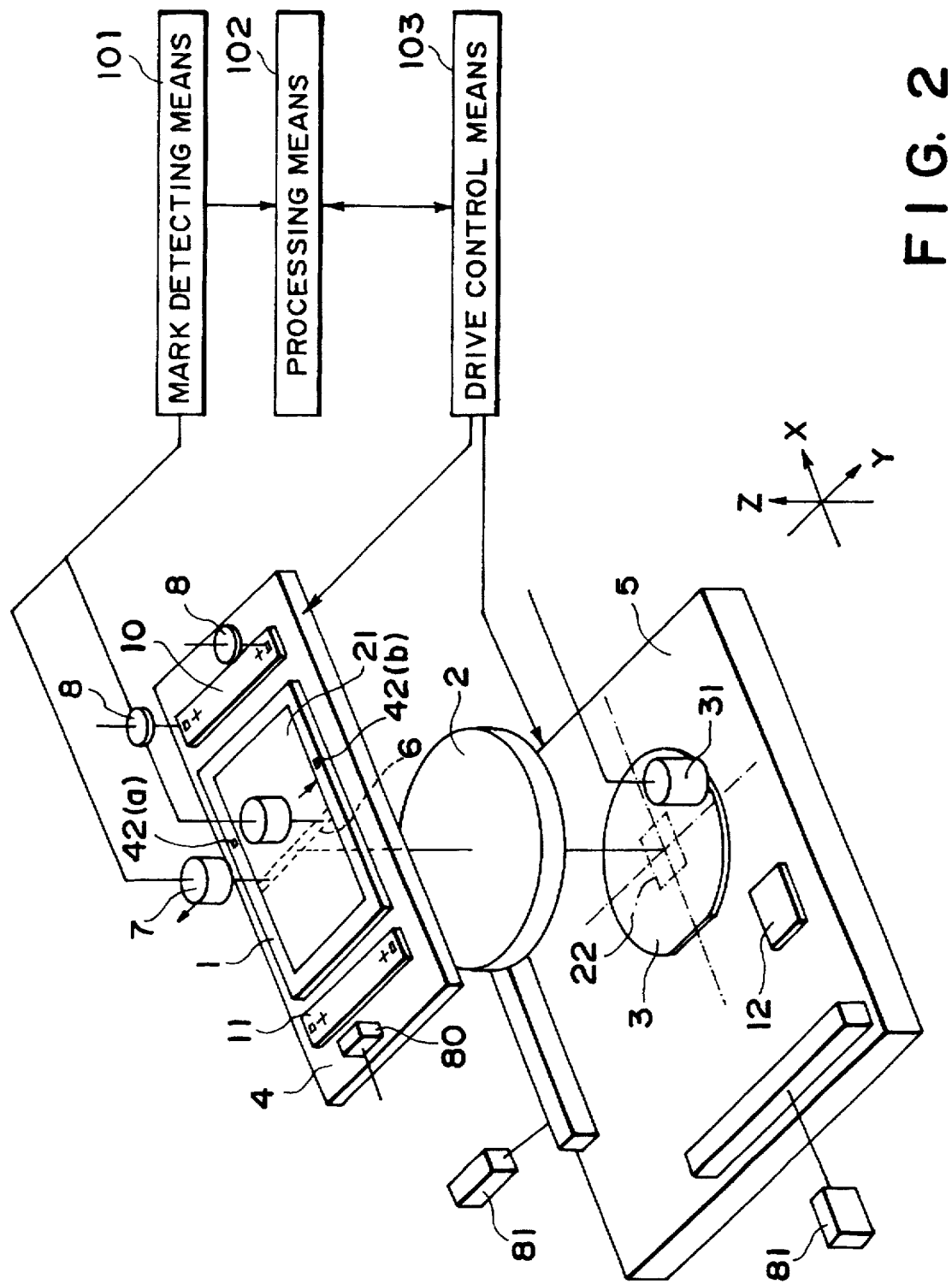
FIG. 2 is a schematic view of main portion of a scanning exposure apparatus according to a first embodiment of the present invention.
Figure 3:
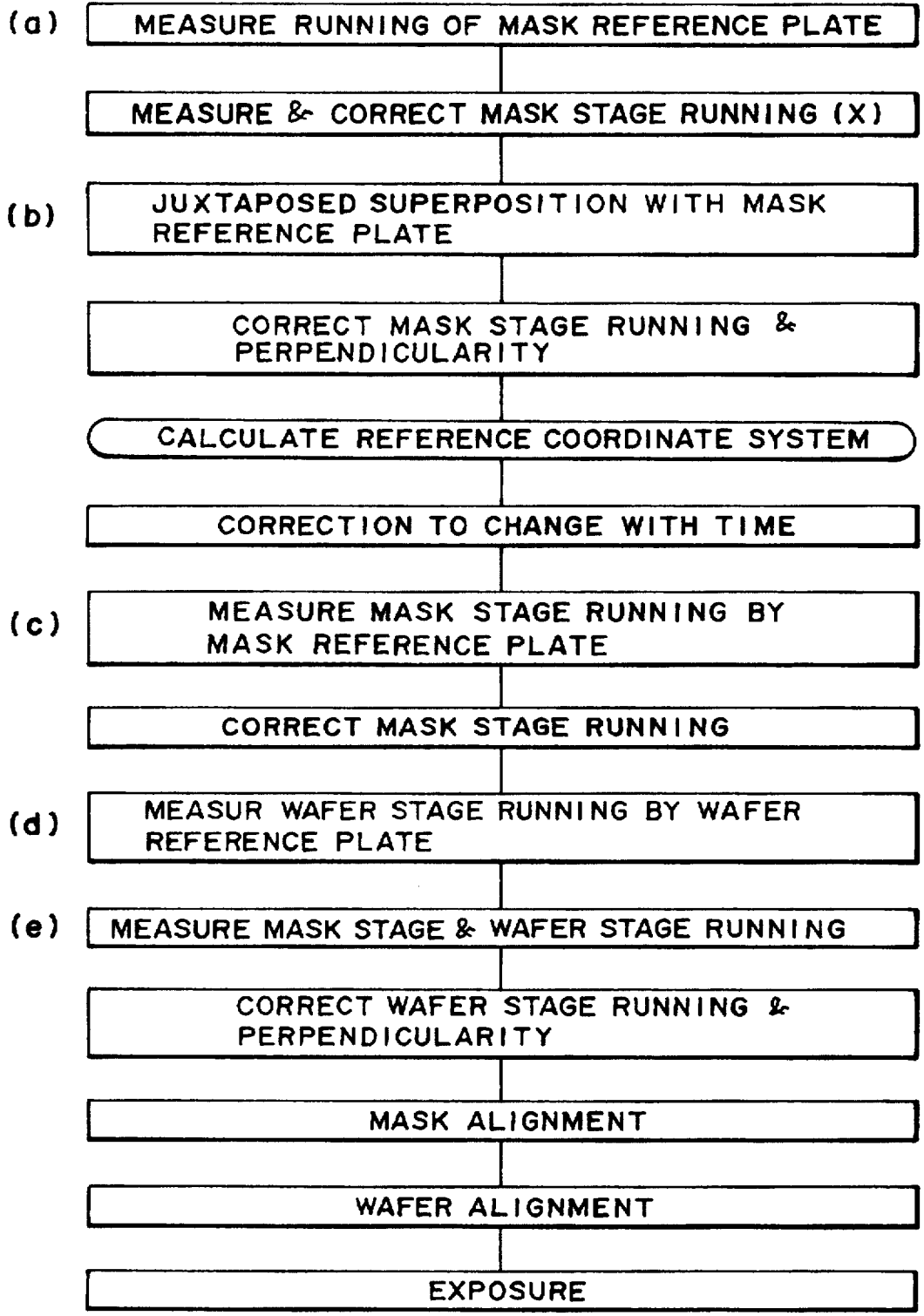
FIG. 3 is a flow chart for explaining operation of scanning exposure apparatus of the first embodiment.

FIG. 2 shows a scanning exposure apparatus according to a first embodiment of the present invention. FIG. 3 is a flow chart in this embodiment, and FIG. 4 is a schematic view for explaining details of the flow chart.

In FIG. 2, a mask 1 having an original formed thereon is placed on a mask stage 4 which is drive-controlled in X and Y directions by a laser interferometer 80 and a drive control means 103. The mask stage 4 is supported by a main frame (not shown) of the apparatus. Wafer (photosensitive substrate) 3 is placed on a wafer stage 5 which is drive-controlled by a laser interferometer 81 and the drive control means 103. The wafer stage 5 is supported by the main frame (not shown) of the apparatus. The mask 1 and the wafer 3 are disposed at positions which are optically conjugate with each other with respect to a projection optical system 2. Slit-like exposure light 6 from an illumination system (not shown) and extending in the Y direction, in the drawing, illuminates the mask 1, such that it is imaged on the wafer 3 in a size corresponding to the projection magnification of the projection exposure system 2. Scan exposure is performed by moving in the X direction both the mask stage 4 and the wafer stage 5 relative to the slit-like exposure light 6 at a speed ratio corresponding to the optical magnification, to scan the mask 1 and the wafer 3, by which the whole of a device pattern 21 of the mask 1 is transferred to a transfer region (pattern region) on the wafer 3.

In this embodiment, a reference coordinate system for the mask stage 4 and the wafer stage 5 is initially set as follows.

Fixedly mounted on the mask stage 4 are plates 10 and 11 (mask reference plates) such as shown in FIG. 5. On the other hand, fixedly mounted on the wafer stage 5 is a plate 12 (wafer reference plate) such as shown in FIG. 6.

The mask reference plates 10 and 11 have marks 50 and 51 formed thereon. The wafer reference plate 12 has marks 60 and 61 at positions corresponding to those of the marks 50 and 51.

The marks 50 and 51 are disposed at the same level (height) as the pattern bearing surface of the mask 1.

Now, the mark 60 or 61 on the wafer reference plate 12 is moved to the observation position (exposure position) below the projection optical system 2, and it is held stopped there. The mask stage 4 is scanningly moved in the same manner as of during the scanning exposure process. Any relative positional deviations of the marks 50 and 51 with respect to the mark 60 or 61 on the wafer reference plate 12, are observed photoelectrically through an observation microscope 7. Resultant signals are processed by a mark detecting means 101, and information about relative positional relationship is applied to a processing circuit 102.

From the information, any deviation between the direction as determined by the reference plates 10 and 11 (the direction of a straight line that connects marks 50(a) and 51(a) or marks 50(b) and 51(b)) and the X-axis running (scan direction) of the mask stage 4 is detected. The thus detected deviation is memorized into the processing circuit 102. During scan motion of the mask stage, a signal corresponding to the memorized deviation is produced by which the drive control means 103 operates to bring about alignment between the direction as determined by the mask reference plates 10 and 11 and the direction of X-axis running of the mask stage 4 (at (a) in FIG. 3 and (a) in FIG. 4).

Subsequently, adjustment of X-axis running of the mask stage 4 and the wafer stage 5 as well as perpendicularity adjustment of the X-axis running and Y-axis running of the wafer stage 5, are performed. A region that includes vernier marks 70 and 71 formed on the mask reference plate is exposed, and the mask stage 4 and the wafer stage 5 are so driven that, with X and Y steps, these marks are printed superposedly one upon another.

A step error produced thereby is measured and, on the basis of the measurement, a deviation of X-axis running of the mask stage 4 and the wafer stage 5 as well as an error in perpendicularlity between X-axis running and Y-axis running of the wafer stage 5, are calculated. The results are memorized in the processing circuit 102. By using a signal corresponding to the memorized deviation and error, the drive control means 103 operates to provide alignment in running direction during scan exposure between the mask stage 4 and the wafer stage 5. Also, it operates to bring about perpendicularlity between the Y-axis running and X-axis running of the wafer stage 5. Thus, a reference coordinate system for the mask stage 4 and the wafer stage 5 is set (at (b) in FIG. 3 and (b) in FIG. 4).

To the reference coordinate system determined in this manner, correction is made to correct any change of the reference coordinate system with time, such as a change due to a temperature change or to any other external factors, for example.

First, in a similar manner described above, the mark 60 or 61 of the wafer reference plate 12 is moved to the observation position (exposure position) below the projection optical system 2, and it is held stopped there. The mask stage 4 is scanningly moved, and relative positional deviations of the marks 50 and 51, respectively, with respect to the mark 60 or 61 of the wafer reference plate 12 are photoelectrically observed through the observation microscope 7. Resultant signals are processed by the mark detecting means 101, and information related to relative positional relationship of these marks is supplied to the processing circuit 102.

From the information, any deviation between the direction as determined by the reference plates 10 and 11 (the direction of a straight line that connects marks 50(a) and 51(a) or marks 50(b) and 51(b)) and the X-axis running of the mask stage 4 is detected. The thus detected deviation is memorized into the processing circuit 102. During scan motion of the mask stage, a signal corresponding to the memorized deviation is produced by which the drive control means 103 operates to bring about alignment between the direction as determined by the reference plates 10 and 11 and the direction of X-axis running of the mask stage 4 (at (c) in FIG. 3 and (c) in FIG. 4).

Subsequently, the mask stage 4 is driven, and the reference plate 10 or 11 is held fixed at the exposure position. The wafer stage 5 is driven by a predetermined amount and the marks 60 and 61 of the wafer reference plate are observed with respect to the mark 50 or 51, by means of the observation microscope 7, and information related to relative positional relationship between the marks of the mask reference plate and the marks of the wafer reference plate (i.e., positional deviation) is detected.

From the information, a deviation between the direction as determined by the wafer reference plate 12 (the direction of a straight line that connects the marks 60(a) and 61(a) or marks 60(b) and 61(b)) and the X-axis running of the wafer stage 5, is measured (at (d) in FIG. 3 and (d) in FIG. 4).

Further, the mask stage 4 and the wafer stage 5 are moved, and the mark 50 of the mask reference plate 10 and the mark 60 of the wafer reference plate 12 are observed, such that a relative positional relationship (positional deviation) of them is detected. Both of the stages are driven, and similarly the mark 51 of the mask reference plate 11 and the mark 61 of the wafer reference plate 12 are observed, and relative positional relationship (positional deviation) of them is detected.

From the thus detected deviation between the X-axis running of the mask stage 4 and the direction as determined by the wafer reference plate 12 as well as from the deviation, detected as described hereinbefore, between the X-axis run of the wafer stage 5 (coincident with the direction as determined by the mask reference plates 10 and 11) and the direction as determined by the wafer reference plate 12, a deviation of the X-axis running of the wafer stage 5 relative to the X-axis running of the mask stage 4 is calculated. On the basis of the result of calculation, the drive control means 103 operates to correct X-axis movement of the wafer stage 5 so that it is aligned with the X-axis running of the mask stage 4. As a matter of course, if the X-axis motion of the wafer stage 5 is changed, the Y-axis running thereof perpendicular thereto is changed to correct the perpendicularity. Thus, any change of the reference coordinate system with respect to time is corrected.

In this example, the direction as determined by the reference plates 10 and 11 and the direction of X-axis motion of the mask stage 4 are brought into alignment with each other. However, as alternative, (1) a deviation between the direction as determined by the reference plates 10 and 11 and the X-axis running of the mask stage 4, (2) a deviation between the X-axis running of the mask stage 4 and the direction as determined by the wafer reference plate 12, and (3) a deviation between the direction as determined by the mask reference plates 10 and 11 and the direction as determined by the wafer reference plate 12, may be used to calculate a deviation of the X-axis run of the wafer stage 5 with respect to the X-axis run of the mask stage 4 (at (e) in FIG. 3 and (e) in FIG. 4).

With the above-described procedures, alignment of the mask stage 4 and the wafer stage 5 in the scan process is performed by using reference plates.

Next, the mask 1 is brought into alignment with the mask stage 4.

First, mask alignment marks 40(a) and 41(b) on the mask reference plate 10 are observed through an observation microscope 8, and positions of them are detected. Then, the mask stage 4 is moved, and mask alignment marks 42(a) and 42(b) formed on the mask 1 are observed through the observation microscope 8, whereby positions of them are detected.

The drive amount of the mask stage 4 is determined by using the laser interferometer 80. It is applied together with the mark positional information to the processing circuit 102, such that relative positional relationship (amount of positional deviation) between the mask 1 and the reference plate 10 is calculated. The scan direction of the mask 1 and the running of the mask stage 6 are adjusted in light of the result of calculation. That is, the mask 1 is rotationally moved relative to the mask stage 6. Also, the drive control means 103 may be used so that the running of the mask stage 4 is aligned with the direction along which the mask 1 is going to be scanned. In that occasion, the running of the wafer stage 5 has to be changed accordingly.

Subsequently, the wafer 3 is brought into alignment with respect to the wafer stage 5.

In order to detect the distance from the center of exposure pattern drawing and the detecting position of the wafer alignment detection system (it is called "base line"), a mark 55 on the stage reference plate 12 is moved to the center of the exposure pattern drawing. Then, from that position, the same mark 55 is moved to the position below an off-axis microscope 31, and the position thereof is detected.

By this, the position of the off-axis microscope 31 with respect to the center of pattern drawing is detected. Then, the wafer 3 alignment is performed in accordance with the global alignment method.

More specifically, among the chips on the wafer 3, those chips which are to be measured are selected. Alignment marks of these selected chips are observed and detected by means of the off-axis microscope 31. From the detected positions of these alignment marks and from the drive amounts of the wafer stage measured by means of the laser interferometer 81, the position of the wafer 3 is calculated by the processing circuit 102.

As described above, the mask stage 4 and the wafer stage 5 are brought into alignment with respect to the reference plates 10 and 11, and the mask 1 and the wafer 3 are brought into alignment with respect to the stages. Then, the exposure process starts.

[Embodiment 2]

Figure 7:
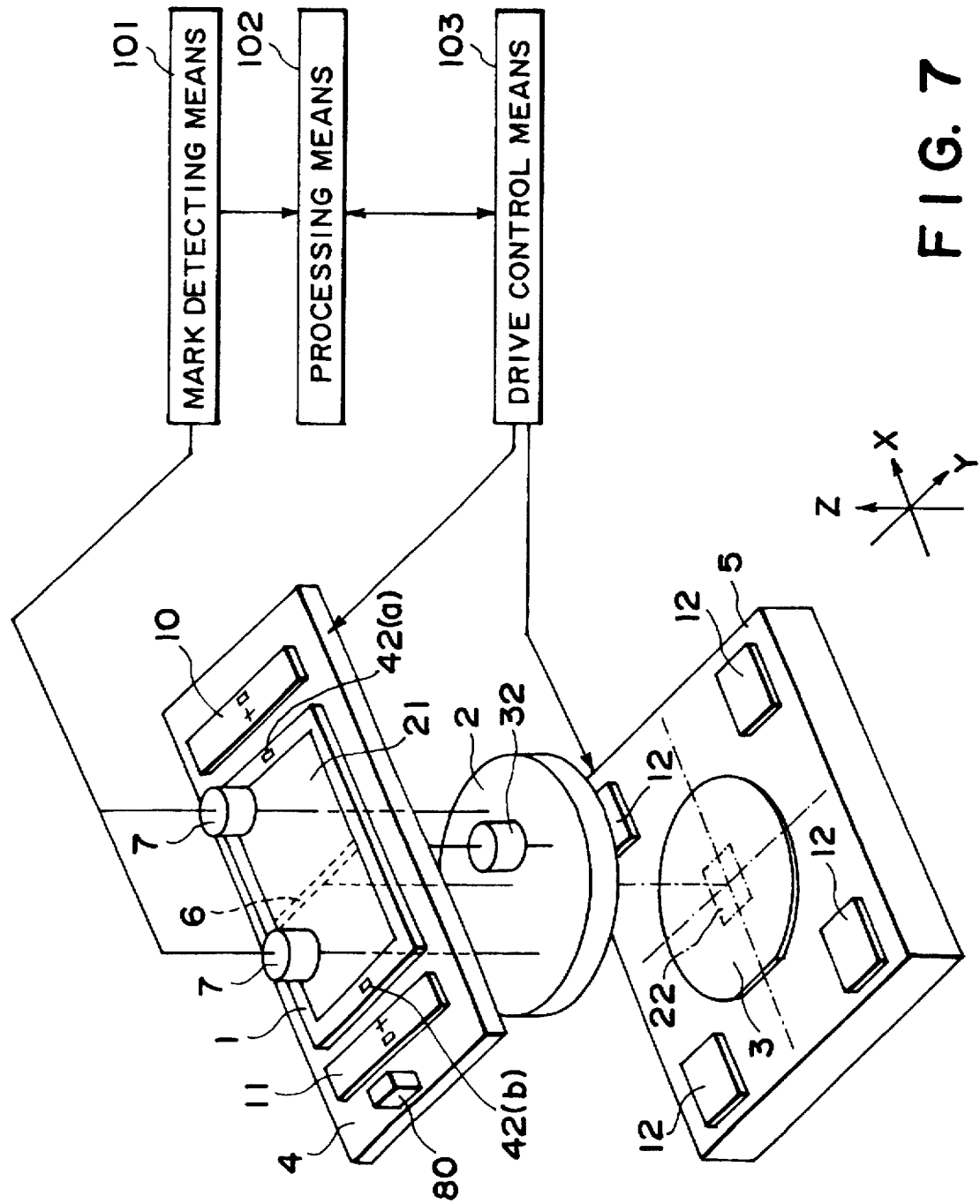
FIG. 7 is a schematic view of a main portion of a scanning exposure apparatus according to a second embodiment of the present invention.
Figure 8:
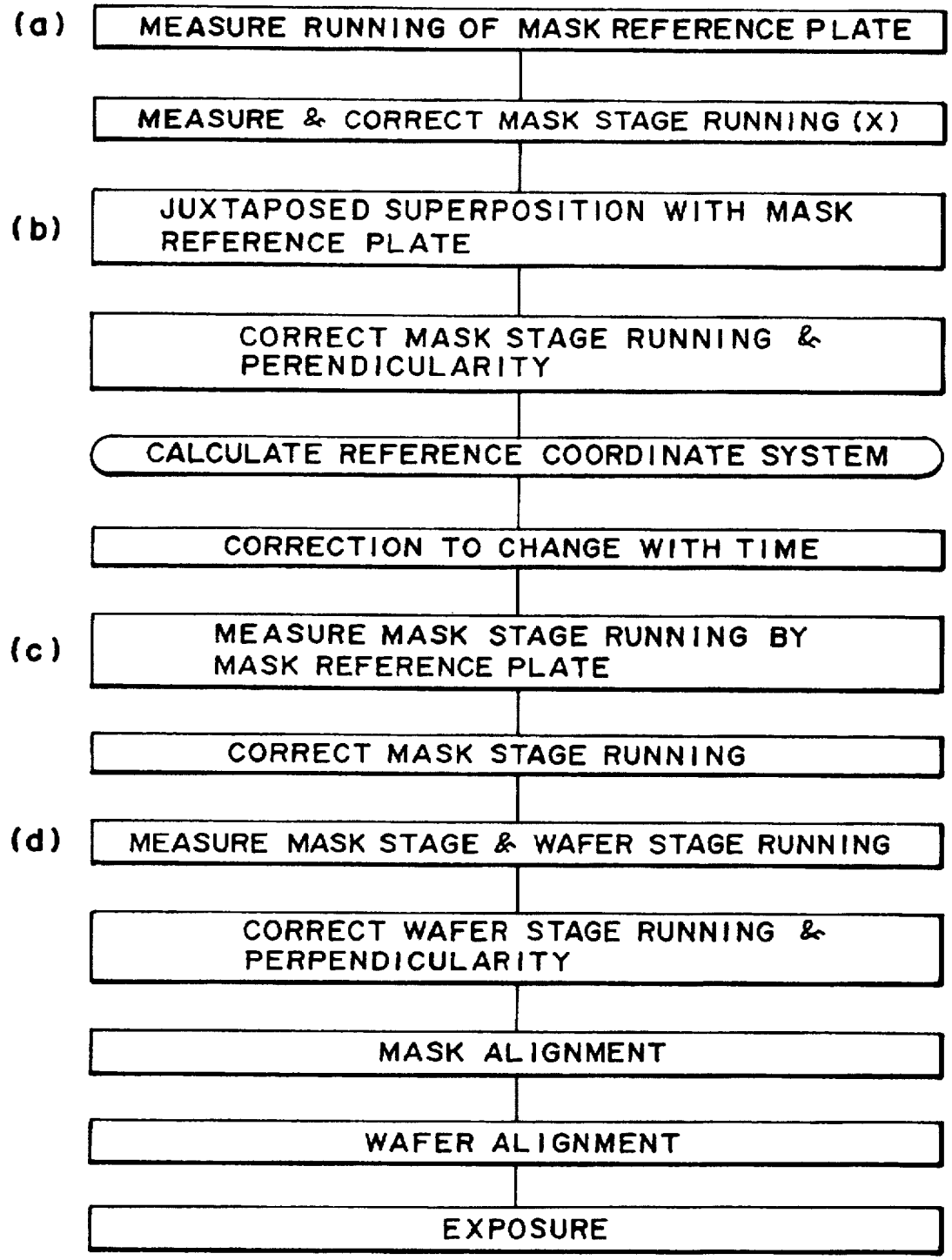
FIG. 8 is a flow chart for explaining operation of the scanning exposure apparatus of the second embodiment.

FIG. 7 illustrates a second embodiment of the present invention. FIG. 8 is a flow chart therefor, and FIG. 9 explains the flow.

Figure 10:
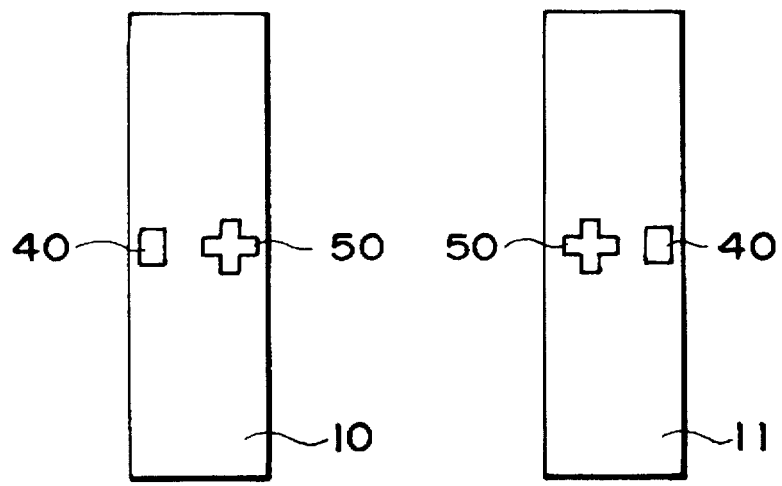
FIG. 10 is a schematic view of a mask reference plate used in the second embodiment.
Figure 11:
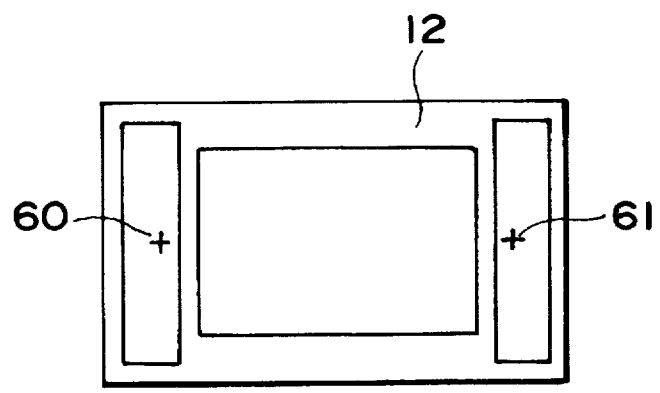
FIG. 11 is a schematic view of a wafer reference plate used in the second embodiment.

In this embodiment, reference plates 10 and 11 and a stage reference plate 12 have alignment marks formed thereon, as illustrated in FIGS. 10 and 11. Also, the observation microscope 7 is placed outside the exposure irradiation area. This arrangement enables to perform the wafer stage corrections at (d) and (e) in FIG. 3 of the first embodiment, at once.

In this embodiment, the observation microscope 7 is not moved and, only by moving the mask stage 4, the mark 40 of the mask reference plate and the mark 60 of the wafer reference plate as well as the mask alignment marks 40 and 42 can be detected.

The omission of movement of the observation microscope is effective to enhance the throughput and precision.

Also, while in the first embodiment the wafer is observed by the off-axis microscope 31, in this embodiment it is detected by means of a TTL microscope 32 wherein observation is made through the projection optical system 2. This enables wafer detection without being affected by any change in environment such as temperature or humidity.

Further, in this embodiment, plural stage reference plates 12 may be provided at different locations on the wafer stage, and this enables correction of the wafer stage 4 running, over the whole surface.

[Embodiment 3]

Figure 12:
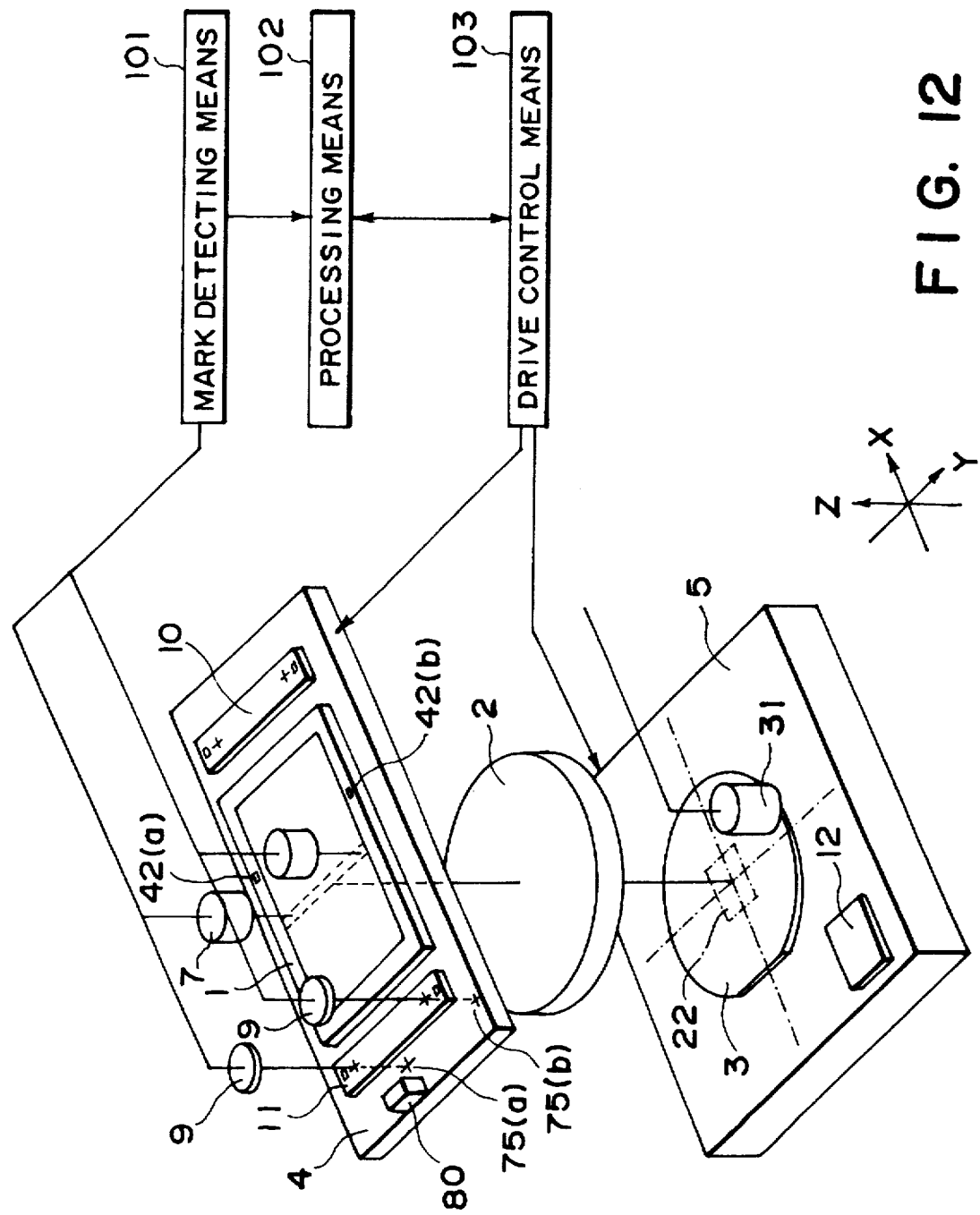
FIG. 12 is a schematic view of a main portion of a scanning exposure apparatus according to a third embodiment of the present invention.

FIG. 12 shows a third embodiment of the present invention. In this embodiment, a reference plate is fixedly mounted on a barrel (holding member) for holding the projection optical system 2, and measurement of the run of the mask stage 4 is performed by using marks 75 formed on the reference plate.

A mark 75 of the barrel and a mark 50 of the mask reference plate 10 are observed by the observation microscope 9, and positions of them are detected. Similarly, the mask stage 4 is moved, and positions of the mark 75 of the barrel and a mark 51 of the mask reference plate 11 are detected. Based on the detection, X-axis running and Y-axis running of the mask stage 4 is corrected. The run correction for the wafer stage and alignment of the mask are performed essentially in the same manner as of the first embodiment.

Since the reference mark 75 is formed on the barrel of the projection optical system 2, it is not necessary to move the wafer stage 5 for correction of the running of the mask stage 4. Also, measurement can be done while holding the observation microscope fixed. Thus, enhanced precision is attainable.

[Embodiment 4]

FIG. 13 shows a fourth embodiment of the present invention. This embodiment corresponds to a modified form of the third embodiment, wherein the mask 1 alignment also is performed by using a mark formed on the barrel of the projection optical system 2.

More specifically, after correction of the running of the mask stage 4, the observation microscope 9 is used to observe the mark 75 of the barrel and mask alignment marks 42(a) and 42(b), and positions of them are detected. Based on this, the mask 1 is brought into alignment with the mask stage 4. Thus, this embodiment does not need use of a mark for the mask alignment, as shown in FIG. 14.

Since the mask stage 4 and the mask 1 are observed with respect to a common mark, mark 75, by using the observation microscope which is held fixed, further enhancement of precision is assured. Also, since correction of the mask stage 4 running is made without moving the wafer stage 5, higher throughput is attainable.

[Embodiment 5]

Figure 15:
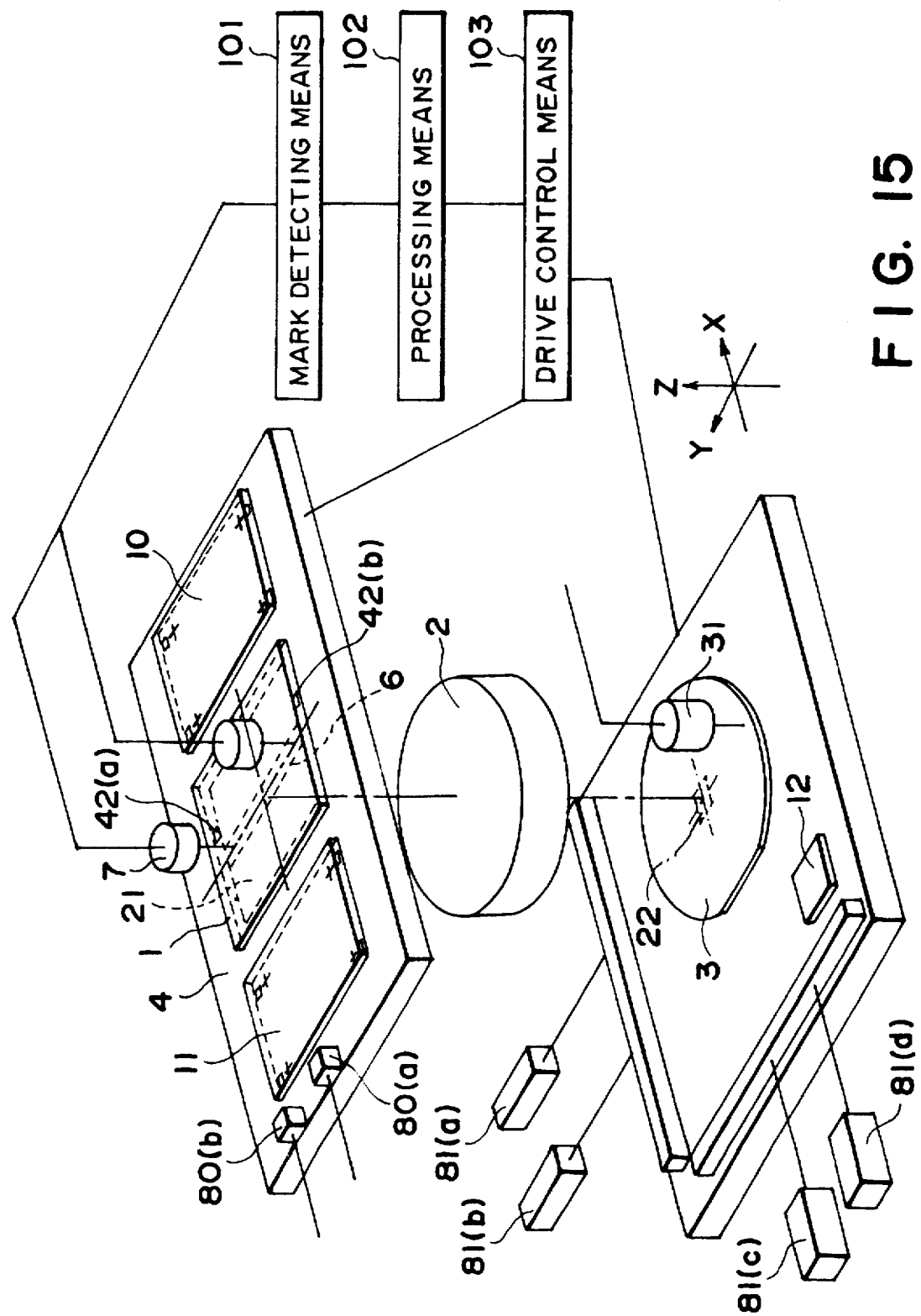
FIG. 15 is a schematic view of a main portion of a scanning exposure apparatus according to a fifth embodiment of the present invention.
Figure 16:
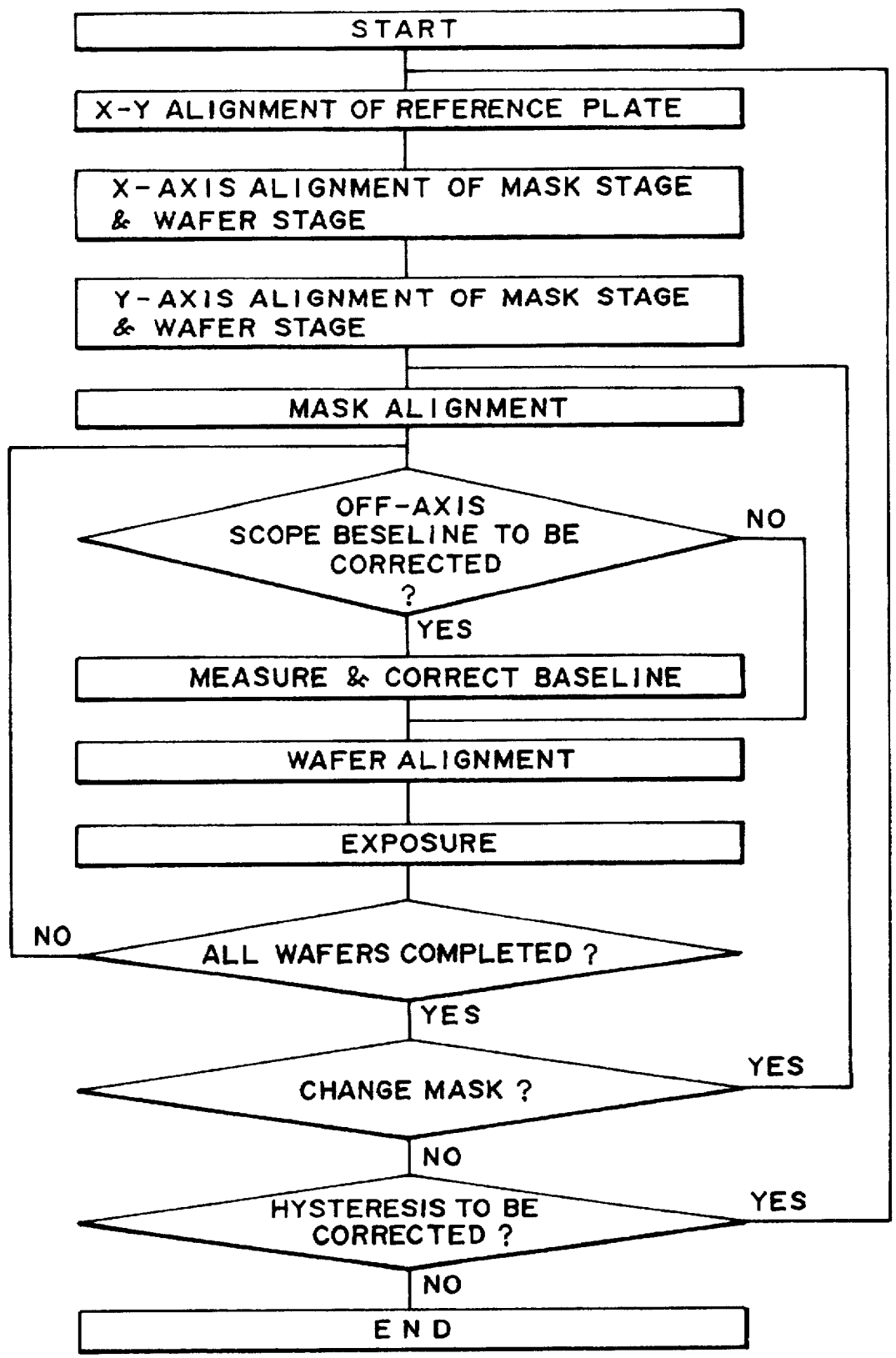
FIG. 16 is a flow chart for explaining operation of the scanning exposure apparatus according to the fifth embodiment.
Figure 17:
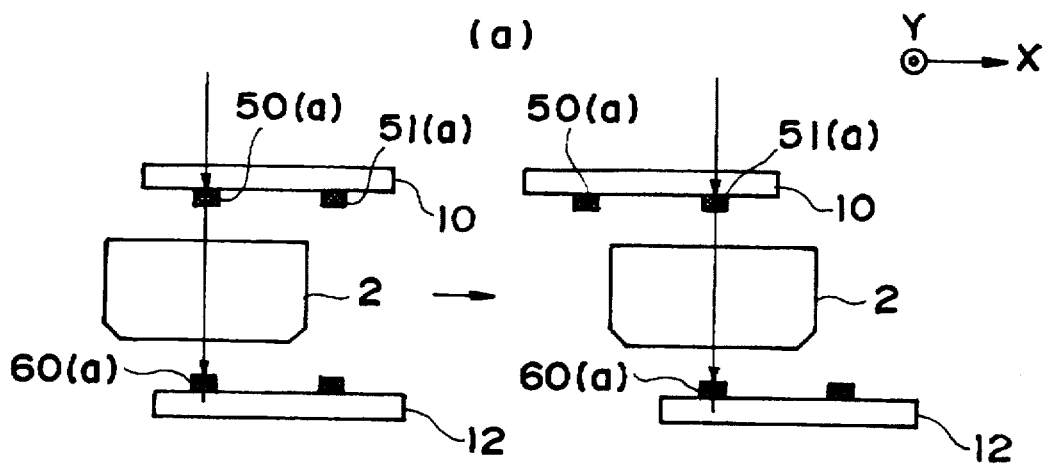
FIG. 17(a) and 17(b) are schematic views is a schematic view for explaining details of the operation in the flow chart of FIG. 16.

FIG. 15 shows a scanning exposure apparatus according to a fifth embodiment of the present invention. FIG. 16 is a flow chart, and FIGS. 17 and 18 explain the flow of operation.

In FIG. 15, a mask 1 having an original formed thereon is placed on a mask stage 4 which is drive-controlled in X and Y directions by a laser interferometer 80 and a drive control means 103. The mask stage 4 is supported by a main frame (not shown) of the apparatus. Wafer (photosensitive substrate) 3 is placed on a wafer stage 5 which is drive-controlled in the X and Y directions by a laser interferometer 81 and the drive control means 103. The wafer stage 5 is supported by the main frame (not shown) of the apparatus. The mask 1 and the wafer 3 are disposed at positions which are optically conjugate with each other with respect to a projection optical system 2. Slit-like exposure light 6 from an illumination system (not shown) and extending in the Y direction, in the drawing, illuminates the mask 1, such that it is imaged on the wafer 3 in a size corresponding to the projection magnification of the projection exposure system 2. Scan exposure is performed by moving in the X direction both the mask stage 4 and the wafer stage 5 relative to the slit-like exposure light 6 at a speed ratio corresponding to the optical magnification, to scan the mask 1 and the wafer 3, by which the whole of a device pattern 21 of the mask 3 is transferred to a transfer region (pattern region) on the wafer 3.

Now, description will be made on the manner of aligning the scan direction of the mask stage and the scan direction of the wafer stage, namely, the manner of detecting the relation between a coordinate system as defined by the actual scan direction of the mask stage and a coordinate system as defined by the actual scan direction of the wafer stage and of aligning the scan directions of the mask stage and the wafer stage.

Fixedly mounted on the mask stage is a mask reference plate 10 (or 11) such as shown in FIG. 19. On the other hand, fixedly mounted on the wafer stage is a wafer reference plate 12 such as shown in FIG. 20.

The mask reference plate 10 (or 11) has marks 50(a), 50(b), 51(a) and 51(b) which are formed at the same level (height) as of the pattern bearing surface of the mask 1. The wafer reference plate 12 has marks 60(a), 60(b), 61(a) and 61(b) at positions corresponding to those of the marks of the mask reference plate. These marks are formed on respective reference plates in accordance with design coordinate systems, and thus their relative positional relationship is known.

Step 1

Now, the marks 60(a) and 60(b) (or marks 61(a) and 61(b)) on the wafer reference plate 12 are moved to the observation position (exposure position) below the projection optical system 2, and they are held stopped there. Also, the marks 50(a) and 50(b) (or marks 51(a) and 51(b)) of the mask reference plate 10 (or 11) on the mask stage 4 are moved to the exposure position, and they are held stopped there. The relative positional relationship of these marks 60(a), 60(b), 50(a) and 50(b) is measured by using an observation microscope 7. The value measured at that time corresponds to relative X-Y alignment (X-Y origin) between the wafer reference plate 12 and the wafer reference plate 12. Namely, relative positional relationship between alignment marks of the mask reference plate 10 and alignment marks of the wafer reference plate 12 is detected through the projection optical system 2, and the relationship between a coordinate system as determined by the alignment marks of the mask reference plate 10 and the coordinate system as determined by the alignment marks of the wafer reference plate 12 is detected.

Step 2-1

As shown in FIG. 17(a), the marks 60(a) and 60(b) of the wafer reference mark 12 are held fixed, and the positions of the marks 50(a) and 50(b) of the mask reference plate 10 with respect to the marks 60(a) and 60(b) are measured by using the microscope 7. Only the mask stage 4 is scanningly moved, and the positions of the marks 51(a) and 51(b) of the mask reference plate 10 with respect to the marks 60(a) and 60(b) are measured by using the microscope 7. By this, the parallelism of an axis as defined by the marks 50(a) and 51(a) (or marks 50(b) and 51(b)) of the mask reference plate 10 with respect to the scan direction (X direction) of the mask stage 4, is detected. Namely, the relation between the coordinate system as determined by alignment marks of the mask reference plate and the coordinate system as determined by actual scan direction (X direction) of the mask stage, is detected.

Step 2-2

As shown in FIG. 17(b), the marks 50(a) and 50(b) of the mask reference plate 10 are held fixed, and the positions of the marks 60(a) and 60(b) of the wafer reference plate 12 with respect to the marks 50(a) and 50(b) are measured by using the microscope 7. Only the wafer stage 5 is scanningly moved, and positions of the marks 61(a) and 61(b) of the wafer reference plate 12 with respect to the marks 50(a) and 50(b) are measured. By this, the parallelism of the axis as defined by the marks 60(a) and 61(a) (or marks 60(b) and 61(b)) of the wafer reference plate 12 with respect to the scan direction (X direction) of the wafer stage 5, is detected. Namely, the relationship between the coordinate system as determined by alignment marks of the wafer reference plate and the coordinate system as determined by actual scan direction (X direction) of the wafer stage, is detected.

Step 3-1

Figure 18:
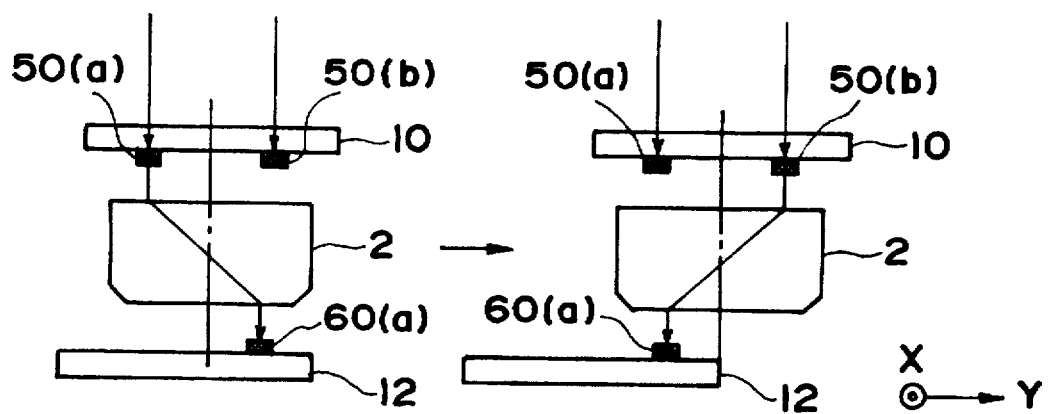
FIG. 18 is a schematic view for explaining details of the operation in the flow chart of FIG. 16.

As shown in FIG. 18, the marks 50(a) and 50(b) of the mask reference plate 10 are held fixed, and the positions of the mark 60(a) of the wafer reference plate 12 with respect to the mark 50(a), is measured by using the microscope 7. Only the wafer stage 5 is scanningly moved, and the position of the mark 60(a) of the wafer reference plate with respect to the mark 50(b) is measured by using the microscope 7. By this, the parallelism of the axis as defined by the marks 50(a)

and 50(b) of the mask reference plate with respect to the step direction (Y direction) of the wafer stage 5, is detected. Namely, the relationship between the coordinate system as determined by alignment marks of the mask reference plate and the coordinate system as determined by the actual scan direction (Y direction) of the wafer stage, is detected.

Step 3-2

In a similar manner as described above, the marks 60(a) and 60(b) of the wafer reference plate 12 are held fixed, and the position of the mark 50(a) of the mask reference plate with respect to the mark 60(a), is measured by using the microscope 7. Only the mask stage 4 is scanningly moved, and the position of the mark 50(a) of the mask reference plate with respect to the mark 60(b), is measured by using the microscope 7. By this, the parallelism of the axis as defined by the marks 60(a) and 60(b) of the wafer reference plate 10 with respect to the step direction (Y direction) of the mask stage 4, is detected. Namely, the relation between the coordinate system as determined by alignment marks of the wafer reference plate and the coordinate system as determined by actual scan direction (Y direction) of the mask stage, is detected.

From the procedure described above, the following items are detected:

1) The relationship between the coordinate system as determined by alignment marks of the mask reference plate 10 and the coordinate system as determined by alignment marks of the wafer reference plate 12;

2) The relationship between the coordinate system as determined by alignment marks of the mask reference plate and the coordinate system as determined by actual scan direction (X direction) of the mask stage;

3) The relationship between the coordinate system as determined by alignment marks of the wafer reference plate and the coordinate system as determined by actual scan direction (X direction) of the wafer stage;

4) The relationship between the coordinate system as determined by alignment marks of the mask reference plate and the coordinate system as determined by actual scan direction (Y direction) of the wafer stage; and 5) The relationship between the coordinate system as determined by alignment marks of the wafer reference plate and the coordinate system as determined by actual scan direction (Y direction) of the mask stage.

From items 1), 2) and 3) above, the relationship between the coordinate system as determined by the actual scan direction (X direction) of the mask stage and the coordinate system as determined by the actual scan direction (X direction) of the wafer stage is detected, and at least one of the scan directions of the wafer stage and of the mask stage is corrected so that the actual scan direction (X direction) of the mask stage and the actual scan direction (X direction) of the wafer stage are aligned with each other.

Further, from items 4) and 5), an error of perpendicularity of the actual scan direction of the wafer stage along the Y direction, relative to the actual scan direction along the X direction, is detected. Then, the scan direction of the wafer stage along the Y direction is corrected to remove the error.

Practically in a scanning exposure apparatus, the exposure process is performed after the relative alignment of the mask 1 and the wafer 3 is effected. Thus, a coordinate system of mask and wafer has to be taken into account.

In order to take into account the coordinate system of the mask 1, relative position of the mask 1 and the mask reference plate 10 is measured.

First, mask alignment marks 40(a) and 40(b) of the mask reference plate 10 are observed by means of the observation microscope 7, and positions of these marks are detected. The mask stage 4 is moved, and mask alignment marks 42(a) and 42(b) formed on the mask 1 are observed by the observation microscope 7, and positions of them are detected.

The drive amount of the mask stage 4 is determined by using the laser interferometer 80. It is applied together with the mark positional information to the processing circuit 102, such that relative positional relationship (amount of positional deviation) between the mask 1 and the reference plate 10 is calculated. The scan direction of the mask 1 and the running of the mask stage 6 are adjusted in light of the result of calculation. That is, the mask 1 is rotationally moved relative to the mask stage 6. Also, the drive control means 103 may be used so that the running of the mask stage 4 is aligned with the direction along which the mask 1 is going to be scanned. In that occasion, the running of the wafer stage 5 has to be changed accordingly.

Subsequently, the wafer 3 is brought into alignment with respect to the wafer stage 5.

In order to detect the distance from the center of exposure pattern drawing and the detecting position of the wafer alignment detection system (it is called "base line"), a mark 55 on the stage reference plate 12 is moved to the center of the exposure pattern drawing. Then, from that position, the same mark 55 is moved to the position below an off-axis microscope 31, and the position thereof is detected.

By this, the detecting position of the off-axis microscope 31 with respect to the center of pattern drawing is detected. Then, the wafer 3 alignment is performed in accordance with the global alignment method.

More specifically, among the chips on the wafer 3, those chips which are to be measured are selected. Alignment marks of these selected chips are observed and detected by means of the off-axis microscope 31. From the detected positions of these alignment marks and from the drive amounts of the wafer stage measured by means of the laser interferometer 81, the position of the wafer 3 is calculated by the processing circuit 102.

As described, the coordinate systems determined by the scan directions of the wafer stage 5 and the mask stage 4 are brought into alignment with each other and, additionally, the scan directions of the stages are brought into alignment with the directions along which the mask 1 and the wafer 3 are to be scanned. After this, the exposure process starts. The procedure described above is illustrated in FIG. 16.

[Embodiment 6]

Figure 21:
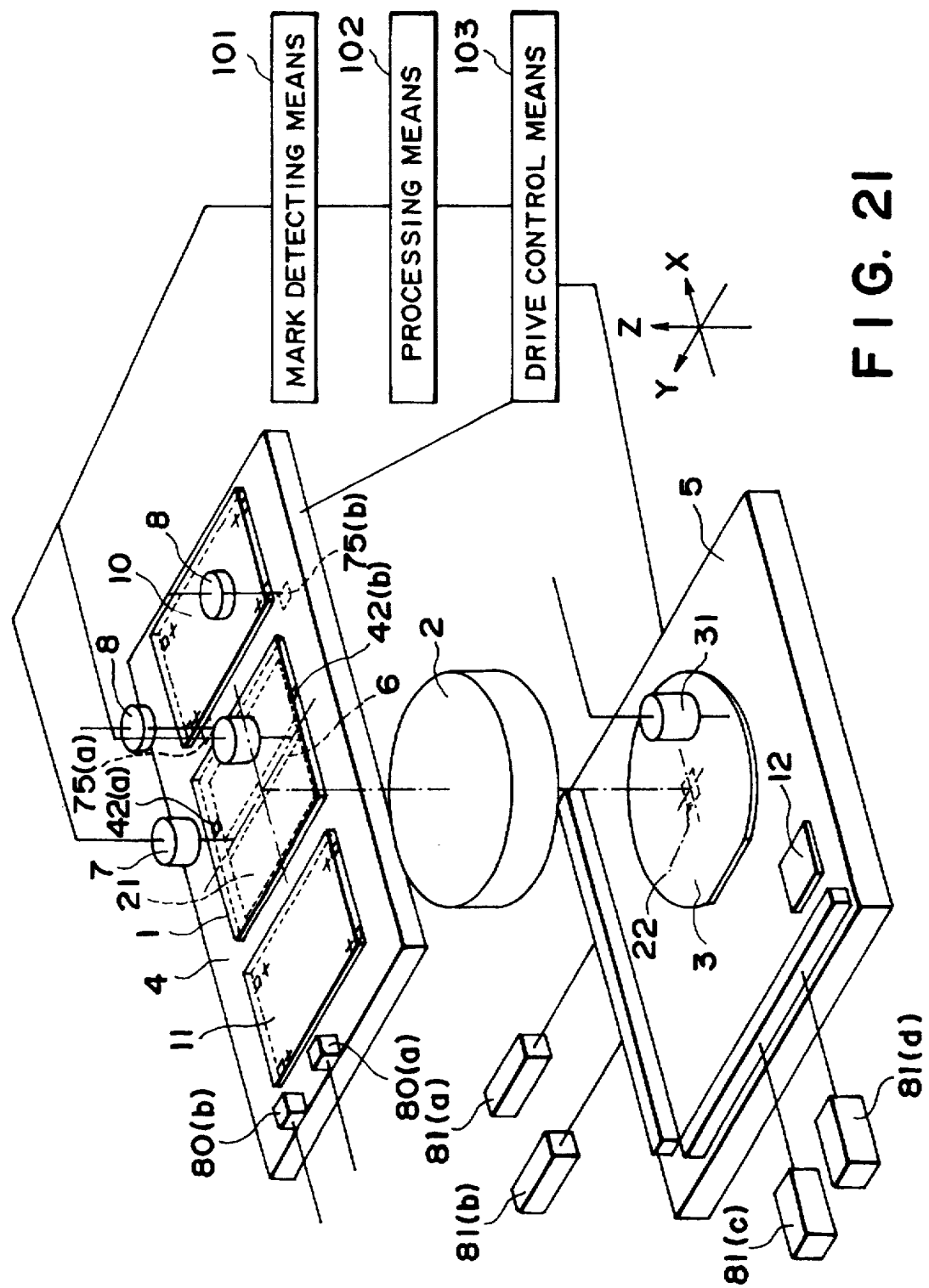
FIG. 21 is a schematic view of a main portion of a scanning exposure apparatus according to a sixth embodiment of the present invention.

FIG. 21 shows a sixth embodiment of the present invention. In this embodiment, a fixed reference plate is fixedly mounted on a holding member for holding the projection optical system 2, and the mask 1 alignment is performed by using marks 75(a) and 75(b) formed on the reference plate.

The mask stage 4 is moved beforehand so as to move marks 50(a) and 50(b) of the mask reference plate 10 to the positions above the marks 75(a) and 75(b) of the reference plate. The relative positional relationship of these marks 50(a), 50(b), 75(a) and 75(b) is measured by using a reticle alignment microscope 8. Then, the relative positional relationship between alignment marks of the mask reference plate 10 and alignment marks of the fixed reference plate, is detected, and the relationship between a coordinate system as determined by the alignment marks of the mask reference plate 10 and a coordinate system as determined by the alignment marks of the fixed reference plate, is detected. It is to be noted that there is no necessity of executing measurement of the positional relationship between the marks 75(a) and 75(b) of the fixed reference plate and the marks 50(a) and 50(b) of the mask reference plate 10 (or 11), every time a mask is replaced, provided that the positions of the marks 75(a) and 75(b) of the fixed reference plate are stable.

The mask stage is moved so that mask alignment marks 42(a) and 42(b) of the mask are placed at positions above the marks 75(a) and 75(b). In the vicinity of this position, mask replacement is performed.

Then, relative positional relationship between the marks 42(a), 42(b), 75(a) and 75(b) is measured by using the reticle alignment microscope 8. Then, relative positional relationship between alignment marks of the mask and alignment marks of the fixed reference plate, is detected, and the relationship between a coordinate system as determined by alignment marks of the mask 4 and a coordinate system as determined by alignment marks of the fixed reference plate, is detected. In consideration of the result of detection and of the relationship between the coordinate system as determined by alignment marks of the mask reference plate 10 and the coordinate system as determined by alignment marks of the fixed reference plate, the mask 1 is rotationally moved relative to the mask stage 4. Alternatively, the drive control means 103 may be used to control the scan direction of the mask stage 6 so that the scan direction of the mask stage 4 is in alignment with the scan direction along which the mask 1 is to be scanned.

Further, the marks 75(a) and 75(b) of the reference plate may be provided at positions below the mask alignment mark 42(a) and 42(b) of the mask stage assumed when the mask is placed at the exposure position. Namely, the mask stage may be moved to place the marks 42(a) and 42(b) (or marks 75(a) and 75(b)) at the observation position of the reticle alignment microscope 8, and the mask alignment may be performed. The positional relationship between the marks 75(a) and 75(b) and the marks 50(a) and 50(b) can be measured by using the reticle alignment microscope 8 or by using the microscope 7, while the mask is being loaded. If the positions of the marks 75(a) and 75(b) of the fixed reference plate are stable, the measurement of positional relationship in that occasion need not be performed every time a mask is replaced.

The remaining portion of this embodiment is essentially the same as of the fifth embodiment.

[Embodiment 7]

Figure 22:
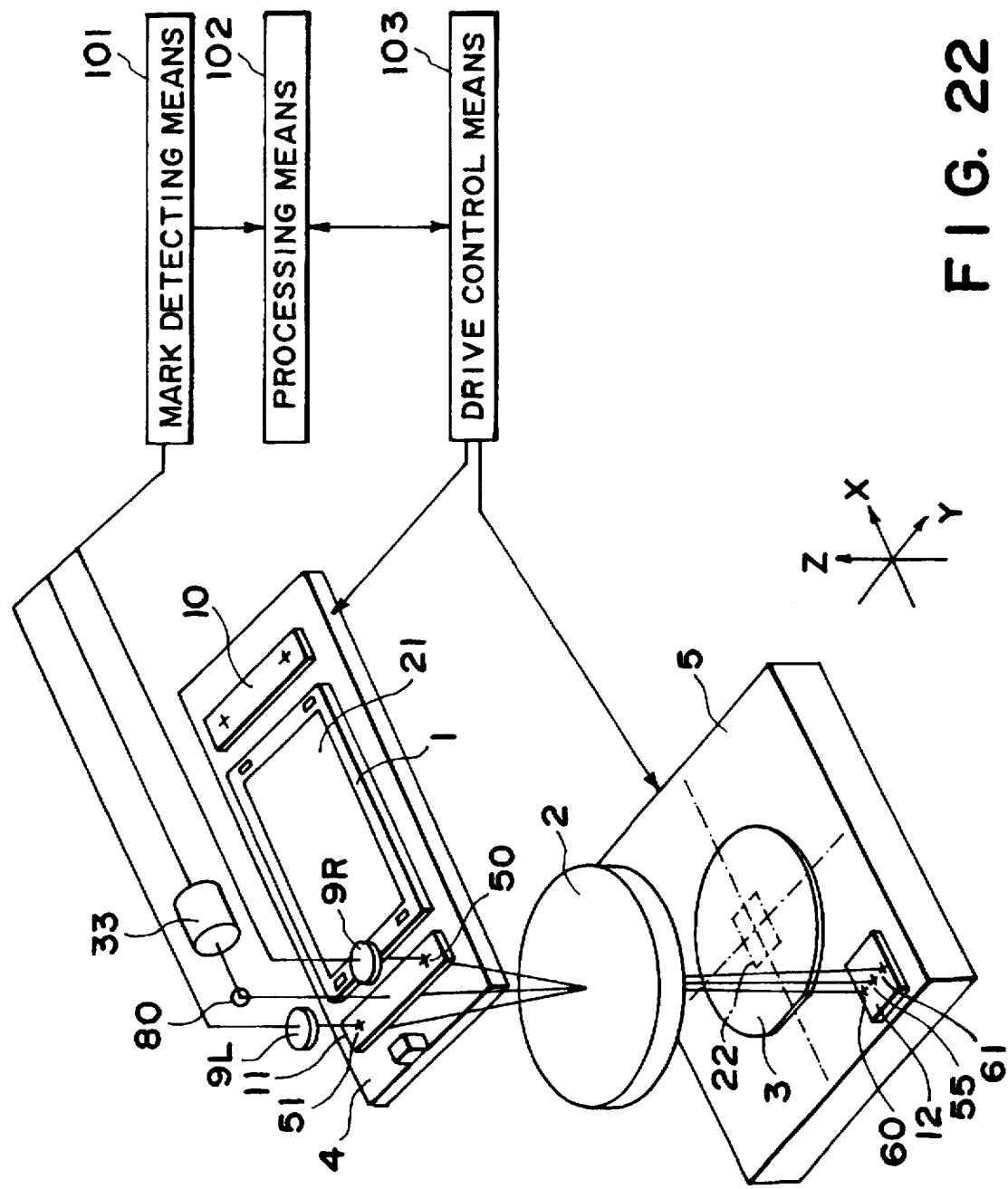
FIG. 22 is a schematic view of a main portion of a scanning exposure apparatus according to a seventh embodiment of the present invention.

FIG. 22 shows a projection exposure apparatus according to a seventh embodiment of the present invention. Mask 1 having an original formed thereon is supported by a main frame of the apparatus through a mask stage 4 which is drive-controlled in X and Y directions by a laser interferometer (not shown) and a drive control means 103. Wafer (photosensitive substrate) 3 is supported by the main frame of the apparatus through a wafer stage 5 which is drive-controlled by a laser interferometer (not shown) and the drive control means 103. The mask 1 and the wafer 3 are disposed at positions which are optically conjugate with each other with respect to a projection optical system 2. For projection exposure, slit-like exposure light from an illumination system (not shown) illuminates the mask 1, such that an optical image is projected on the wafer 3 in a size corresponding to the optical magnification of the projection exposure system 2.

This embodiment is applied to a scanning exposure apparatus, and scan exposure is performed by moving in the X direction both the mask stage 4 and the wafer stage 5 relative to the slit-like exposure light 6 at a speed ratio corresponding to the optical magnification of the projection optical system 2, to scan the mask 1 and the wafer 3. By this, the whole of a device pattern 21 of the mask 3 is transferred to a transfer region (pattern region) on the wafer 3.

In this embodiment, the projection optical system 2 consists only of refracting elements. However, a projection optical system having a combination of reflecting elements and refracting elements may be used. Also, a reduction projection optical system as in the present embodiment or a unit magnification optical system may be used, with the same advantageous results.

Fixedly mounted on the mask stage 4 are mask reference plates 10 and 11 which are disposed on the X direction (scan direction) side of the mask 1. On the other hand, fixedly mounted on the wafer stage 5 is a wafer reference plate 12.

Figure 23:
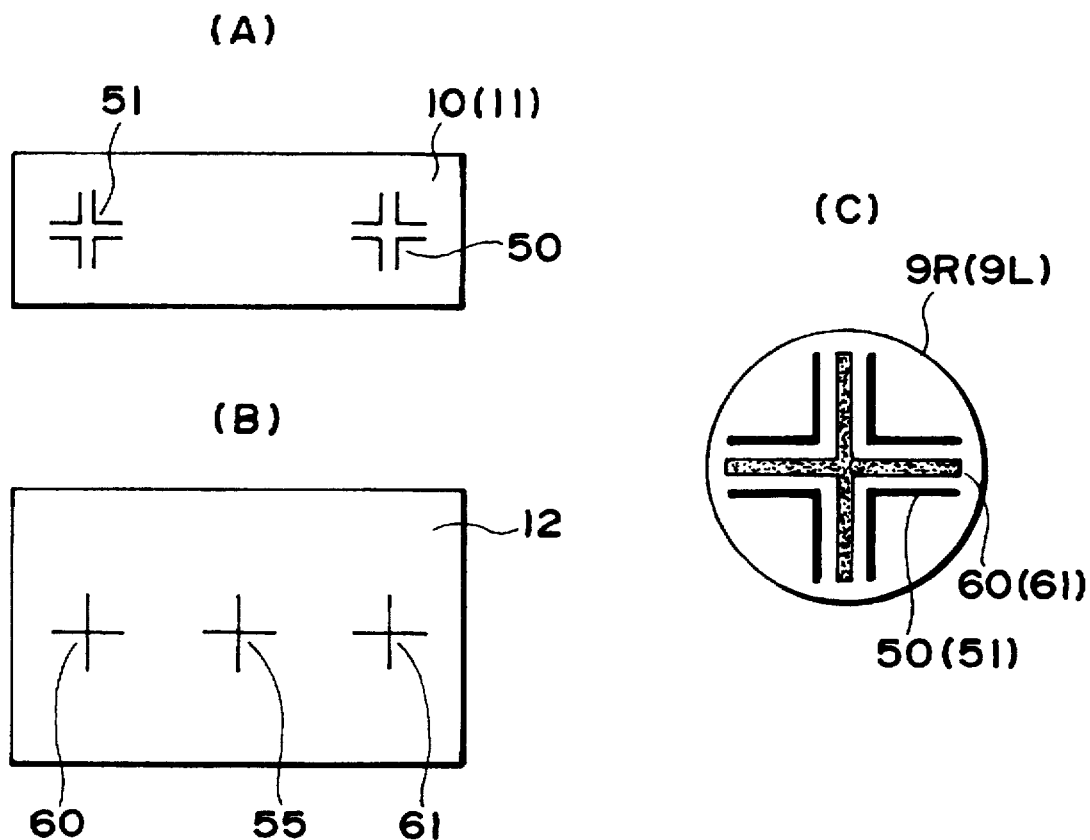
FIGS. 23A–23C are schematic views, respectively, for explaining a mask reference plate and a wafer reference plate used in the seventh embodiment of the present invention.

The mask reference plates 10 and 11 have marks 50 and 51 as shown in FIG. 23A. The wafer reference plate 12 has marks 60 and 61 as shown in FIG. 23B, at positions (transfer position to be defined by the projection optical system 29) corresponding to the marks of the mask reference plate. Here, the marks 50 and 51 of the mask reference plates 10 and 11 are disposed at the same level as of the pattern bearing surface of the mask 1, and the marks 60 and 61 of the wafer reference plate 12 are disposed substantially at the same level as of the surface of the wafer 3 to be exposed.

Observation microscopes 9L and 9R are arranged to perform simultaneous observation of marks 50 and 51 of the mask reference plate 10 and 11 and an object (mark) on the pattern surface of the mask 1 as well as marks 60 and 61 of the wafer reference plate 12 and an object (mark) on the wafer 3. A photographically observed imagewise signal is processed by a mark detecting means 101, and information of relative positional relationship is supplied to the processing circuit 102.

For simultaneous observation, light of the same wavelength as of exposure light to be used for the projection exposure may be used as illumination light, this being desirable because it eliminates the necessity of using additional optical system for correcting chromatic aberration produced by the projection optical system 2.

Non-exposure light TTL observation microscope 33 for observation of the wafer 3 is disposed above the mask 1. Alignment light projected from an alignment light source (not shown) which produces light of non-exposure or non-sensitizing wavelength (or it may be an optical fiber for guiding light from a light source), is reflected by a mirror 80 toward the mask reference plate 11. Central portion of the mask reference plate 11 is formed by a glass of material transparent to non-exposure wavelength. Thus, the reference plate as well as an opening formed in the mask stage below it serves to transmit the alignment light.

The alignment light passing the mask reference plate 11 goes through the projection optical system 2 and it illuminates the wafer 3. The light is reflected and scattered by an alignment mark or marks formed on the wafer 3. Reflected and scattered light goes again through the projection optical system 2 and the mask reference plate 11, and then it is reflected by the mirror 80 toward the non-exposure light TTL observation microscope 33. In this manner, a mark image of alignment mark of the wafer 3 is observed by an image pickup device such as CCD, for example, at a suitable magnification. From the position of the mark image of the alignment mark of the wafer 3 as detected by the image pickup device and a measured value of the laser interferometer which drive-control the wafer stage 5, the position of the wafer 3 with respect to the main frame of the apparatus is measured. The photoelectrically observed imagewise signal is processed by the mark detecting means 101, and information of positional relationship is applied to the processing circuit 102, which information is used in combination with the information supplied from the drive control means 103 to the processing circuit 102, as effective positional information. Observation of the mark 55 of the wafer reference plate using the non-exposure light TTL observation microscope 33 is performed in the same procedure as the observation of an alignment mark of the wafer 3.

Now, the wafer stage 5 is driven and then stopped so that the marks 60 and 61 of the wafer reference plate 12 are placed at the observation position (exposure position) of the observation microscopes 9L and 9R, below the projection optical system 2. Similarly, the mask stage 4 is scanningly moved as in the scanning exposure process and then it is stopped so that the marks 50 and 51 of the mask reference plate 11 are placed within the observation field of the observation microscope 9L and 9R.

In this state, relative positional deviation between the marks 50 and 60 and between the marks 51 and 61 is observed through the observation microscopes 9L and 9R, as shown in FIG. 23C. The relative positional relationship as observed represents the location on the wafer stage 3 where the mask image, being projected and exposed, is projected.

Subsequently, the wafer stage 5 is moved and then stopped so that the mark 55 of the wafer reference plate 12 is placed at the observation position of the non-exposure light TTL observation microscope 31, below the projection optical system 2. The mask stage 4 is moved to a position (normal position for observation of a wafer) where it does not interfere with the alignment light of the non-exposure light TTL observation microscope 33. From the position of the mark 55 of the wafer reference plate 12 to be detected there and from a measured value of the laser interferometer which drive-controls the wafer stage 5, the position of the wafer 4 with respect to the main frame of the apparatus is measured. The photoelectrically observed imagewise signal is processed by the mark detecting means 101, and information of positional relationship is supplied to the processing circuit 102. This information is used in combination with the information supplied from the drive control means 103 to the processing circuit 102, as final positional information. The final positional information is to be used to correct the positional relationship between the wafer stage 5 and the detection system of the non-exposure light TTL observation microscope 33, with intervention of the mark 55 of the wafer reference plate 12.

The disposition coordinate relationship between the mark 55 and marks 60 and 61 of the wafer reference plate 12 is added to the measured value of the mark 55 of the wafer reference plate 12 obtained through the observation microscope 33 and the measured value of relative position of the marks 60 and 61 of the wafer reference plate 12 and the marks 50 and 51 of the mask reference plate 11 obtained through the observation microscopes 9L and 9R. By this, the location to which the wafer 3 is to be positioned, that is, the base line, is measured and corrected.

It is to be noted that the measurement of alignment position may be done through either bright field image observation or dark field image observation or through either grating interference process using heterodyne or FFT phase detection process. Advantageous results of the invention are attainable with any method.

As described, the base line correction measurement for the non-exposure light TTL observation microscope 33, for high-precision measurement of the position of the mask and wafer with respect to the main frame of the apparatus, is performed by using the mask reference plate 11 and the wafer reference plate 12. This eliminates the necessity of using a reference mask, and it assures high precision and quick correction measurement.

[Embodiment 8]

In this embodiment, measurement of the mark 55 of the wafer reference plate 12 by the observation microscope 33 and measurement of relative position of the marks 60 and 61 of the wafer reference plate 12 and the marks 50 and 51 of the mask reference plate 11, are performed simultaneously without moving the wafer reference plate 12.

In the preceding embodiment, after the measurement through the observation microscopes 9L and 9R is effected, the measurement through the observation microscope 33 is performed. Thus, a drive error of the wafer stage 5 is involved in base line measurement error. Also, the throughput decreases by the driving time of the wafer stage 5. Further, if the wafer reference plate 12 produces a positional deviation with respect to the wafer stage 5, it may lead to a base line measurement error.

In this embodiment, the marks 55, 60 and 61 of the wafer reference plate 12 are so disposed that measurement through the observation microscopes 9L and 9R and measurement through the observation microscope 33 can be performed simultaneously. More specifically, the marks 55, 60 and 61 may be disposed exactly in the same manner as the observation points of the microscopes 9L and 9R and of the microscope 33. Particularly, the mark 55 may be disposed at an intermediate between the marks 60 and 61, this being effective since the error with a positional deviation of the wafer reference plate 12 is smaller.

[Embodiment 9]

In this embodiment, the mask reference plate 11 is provided with a mirror member 81 for directing light to the observation microscope 33.

In the seventh embodiment, the mirror 80 is used as guiding means for directing light to the observation microscope 33, and this mirror 80 is disposed between the illumination system for the scanning projection exposure and the scanning projection exposure slit. Thus, it may interfere with the scanning projection exposure. Thus, the mirror has to be retracted during the exposure process and inserted for the alignment operation. Alternatively, it has to be provided by a mirror member having a characteristic for transmitting exposure wavelength but reflecting alignment wavelength.

Figure 24:
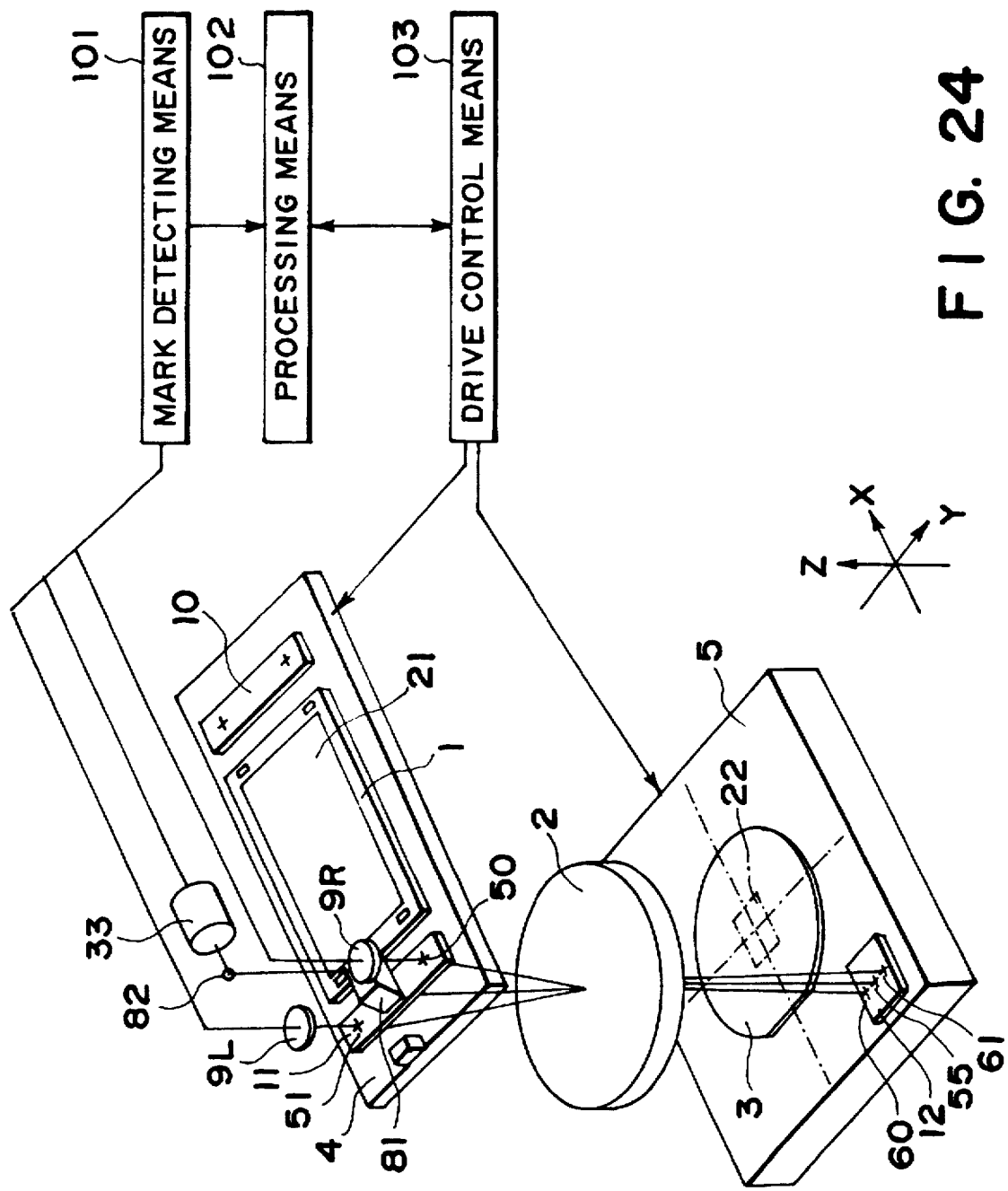
FIG. 24 is a schematic view of a main portion of a scanning exposure apparatus according to another embodiment of the present invention.

In this embodiment, in place of using the mirror 80, a mirror 81 is provided on the mask reference plate 11, as shown in FIG. 24. This mirror 81 comprises a prism shaped mirror, and it is mounted on the mask reference plate 11 and also on the mask stage 4. Thus, it does not interfere with the scanning projection exposure slit during the scanning projection exposure process. Further, along the path of light guiding by the mirror 81, a mirror 82 to be fixed subsequently is disposed so as not to interfere with the scanning projection exposure slit.

This embodiment eliminates the necessity of using a special mirror or a complicated mirror changing mechanism. Thus, the structure is simple.

While in this embodiment the mirror 81 is provided on the mask reference plate 11, the arrangement is not limited to this. Provided that the mirror 81 is incorporated into the mask stage 4 and that it dose not interfere with the scanning projection exposure slit during the scanning exposure process, the mirror 81 may be disposed at any other position, for example, below the mask reference plate 11 and between it and the projection optical system 2. In that occasion, the mirror 81 may have a similar structure as of the observation microscope 33. The essential feature of the present invention applies even if the mirror is not provided above the mask 1 but is disposed between the mask 1 and the projection optical system 2.

[Embodiment 10]

Next, an embodiment of device manufacturing method which uses an exposure apparatus or exposure method described hereinbefore, will be explained.

Figure 25:
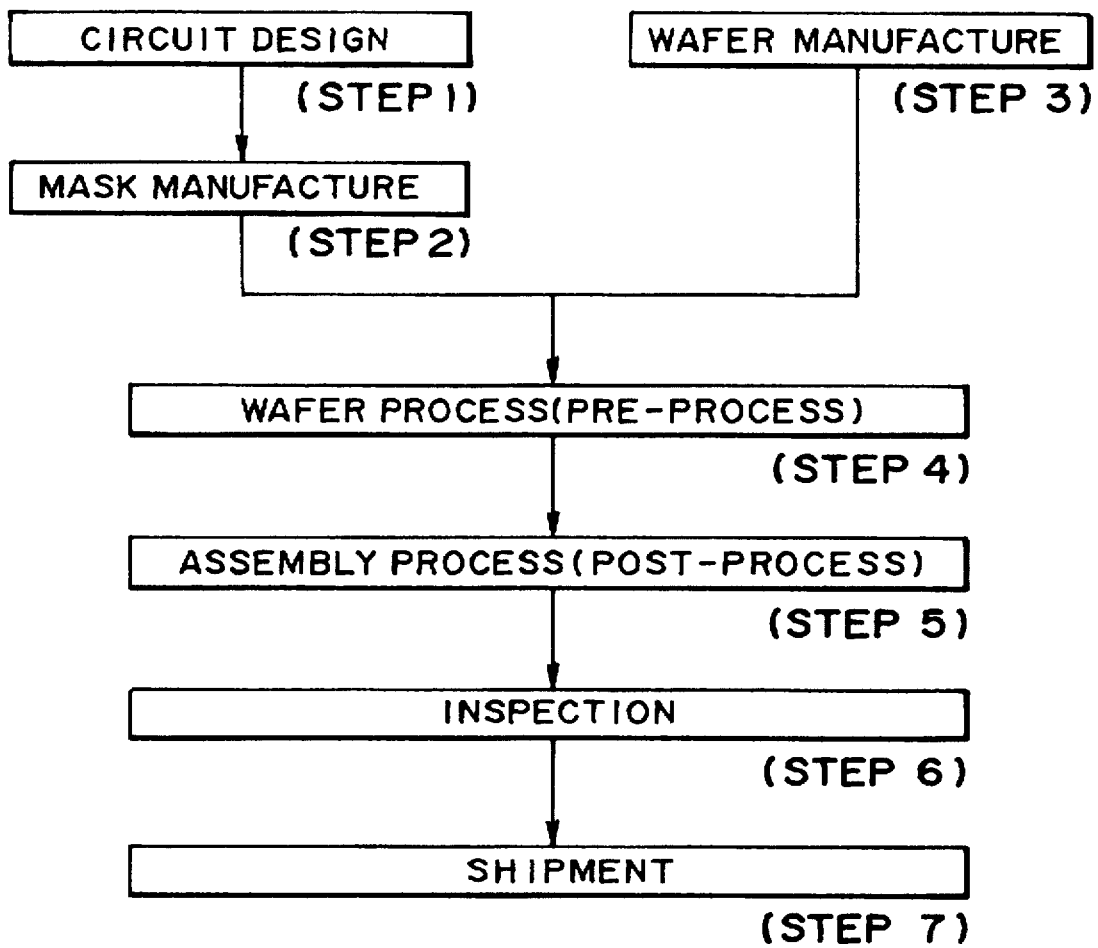
FIG. 25 is a flow chart of semiconductor device manufacturing processes.

FIG. 25 is a flow chart of the sequence of manufacturing a semiconductor device such as a semiconductor chip (e.g. IC or LSI), a liquid crystal panel, a CCD, a thin film magnetic head or micromachine, for example. Step 1 is a design process for designing the circuit of a semiconductor device. Step 2 is a process for manufacturing a mask on the basis of the circuit pattern design. Step 3 is a process for manufacturing a wafer by using a material such as silicon.

Step 4 is a wafer process which is called a pre-process wherein, by using the so prepared mask and wafer, circuits are practically formed on the wafer through lithography. Step 5 subsequent to this is an assembling step which is called a post-process wherein the wafer processed by step 4 is formed into semiconductor chips. This step includes assembling (dicing and bonding) and packaging (chip sealing). Step 6 is an inspection step wherein operability check, durability check and so on of the semiconductor devices produced by step 5 are carried out. With these processes, semiconductor devices are finished and they are shipped (step 7).

Figure 26:
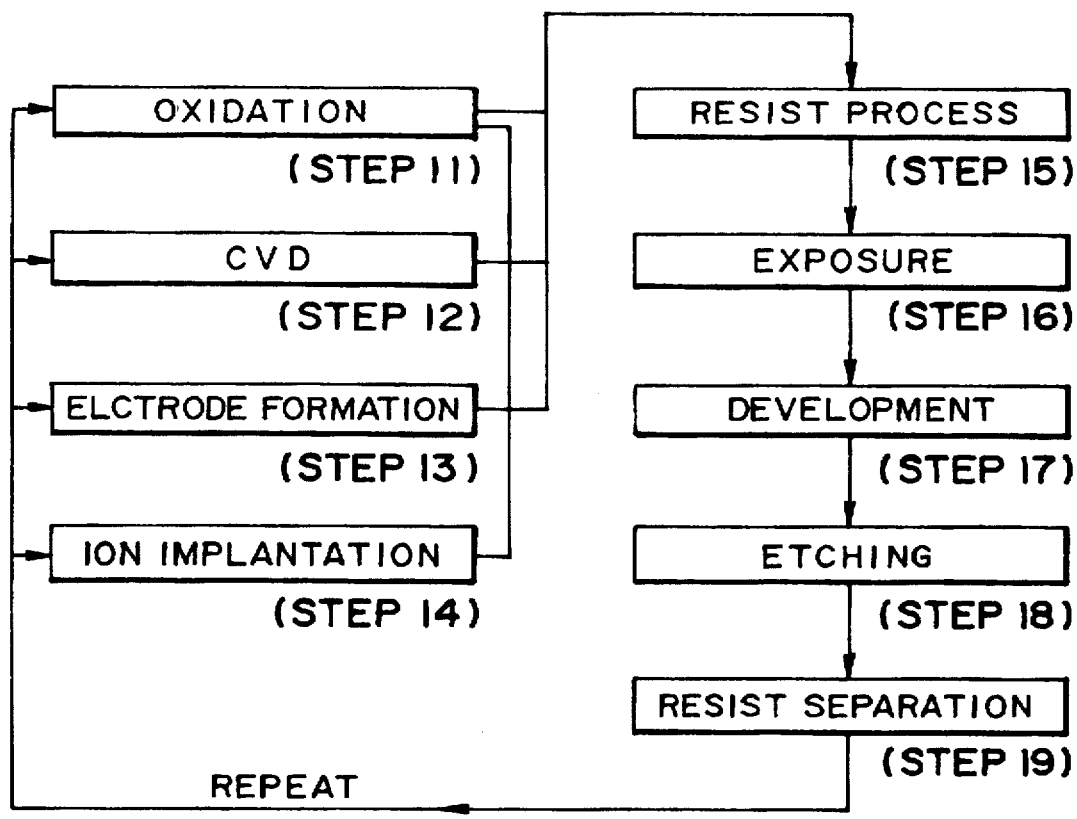
FIG. 26 is a flow chart of a wafer process.

FIG. 26 is a flow chart showing details of the wafer process. Step 11 is an oxidation process for oxidizing the surface of a wafer. Step 12 is a CVD process for forming an insulating film on the wafer surface. Step 13 is an electrode forming process for forming electrodes on the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

While the invention has been described with reference to the structures disclosed herein, it is not confined to the details set forth and this application is intended to cover such modifications or changes as may come within the purposes of the improvements or the scope of the following claims.

What is claimed is:

1. A scanning exposure apparatus, comprising:

a first movable stage being movable while carrying a first object thereon;

a second movable stage being movable while carrying a second object thereon;

a projection optical system for projecting a pattern;

control means serviceable to scan said first and second movable stages in a timed relation and relative to said projection optical system and to project a pattern of the first object onto the second object through said projection optical system;

a first reference plate fixedly mounted on said first movable stage;

a second reference plate fixedly mounted on said second movable stage; and detecting means serviceable to scan at least one of said first and second movable stages to detect a relative positional relationship between alignment marks of said first and second reference plates to thereby determine a scan direction of one of said first and second movable stages.

2. An apparatus according to claim 1, wherein at least one of said first and second reference plates comprises plural alignment marks arrayed along the scan direction.

3. An apparatus according to claim 1, wherein said detecting means comprises observing means for observing one of the alignment marks through said projection optical system.

4. An apparatus according to claim 1, wherein the first object has an alignment mark formed thereon, and wherein said apparatus further comprises means for detecting a relative positional relationship between the alignment mark of the first object and the alignment mark of said first reference plate.

5. A scanning exposure method wherein a first movable stage being movable while carrying a first object thereon and a second movable stage being movable while carrying a second object thereon are scanned in a timed relation and relative to a projection optical system and wherein a pattern of one of the first and second objects is projected onto the other through the projection optical system, said method comprising:

a first detecting step for detecting a relative positional relationship between a first alignment mark of a first reference plate fixedly mounted on the first movable stage and a predetermined alignment mark of a second reference plate fixedly mounted on the second movable stage;

a second detecting step for moving the first movable stage in a scan exposure direction and for detecting a relative positional relationship between the predetermined alignment mark of the second reference plate and a second alignment mark of the first reference plate which second alignment mark is disposed in the scan exposure direction, with respect to the first alignment mark;

a third detecting step for detecting a relative positional relationship between an alignment mark of the first object and at least one of the first and second alignment marks of the first reference plate; and an aligning step for aligning a scan direction of the first object with a scan direction of the first movable stage, on the basis of the detection in said first, second and third detecting steps.

6. A scanning exposure apparatus, comprising:

a first movable stage being movable while carrying a first object thereon;

a second movable stage being movable while carrying a second object thereon;

a projection optical system for projecting a pattern;

control means serviceable to scan said first and second movable stages in a timed relation and relative to said projection optical system and to project a pattern of the first object onto the second object through said projection optical system;

a first reference plate fixedly mounted on said first movable stage;

a second reference plate fixedly mounted on a holding member for holding said projection optical system; and detecting means serviceable to scan said first movable stage to detect a relative positional relationship between alignment marks of said first and second reference plates to thereby determine a scan direction of said first movable stage.

7. An apparatus according to claim 6, wherein said first reference plate comprises plural alignment marks arrayed along the scan direction.

8. A scanning exposure method wherein a first movable stage being movable while carrying a first object thereon and a second movable stage being movable while carrying a second object thereon are scanned in a timed relation and relative to a projection optical system and wherein a pattern of the first object is projected onto the second object through the projection optical system, said method comprising:
- a first detecting step for detecting a relative positional relationship between a first alignment mark of a first reference plate fixedly mounted on the first movable stage and a predetermined alignment mark of a second reference plate fixedly mounted on a holding plate for holding the projection optical system;
- a second detecting step for moving the first movable stage in a scan exposure direction and for detecting a relative positional relationship between the predetermined alignment mark of the second reference plate and a second alignment mark of the first reference plate which second alignment mark is disposed in the scan exposure direction, with respect to the first alignment mark; and
- a determining step for determining a scan direction of one of the first and second movable stages on the basis of the detection at said first and second detecting steps.

9. A method according to claim 8, wherein the first object has an alignment mark formed thereon, and wherein said method further comprises a third detecting step for detecting a relative positional relationship between the alignment mark of the first object and at least one of the first and second alignment marks of the first reference plate and the predetermined alignment mark of the second reference plate.

10. A device manufacturing method wherein a first movable stage being movable while carrying a mask thereon and a second movable stage being movable while carrying a wafer thereon are scanned in a timed relation and relative to a projection optical system and wherein a pattern of the mask is projected and printed onto the wafer through the projection optical system, from which wafer devices are manufactured, said method comprising:
- a first detecting step for detecting a relative positional relationship between a first alignment mark of a first reference plate fixedly mounted on the first movable stage and a predetermined alignment mark of a second reference plate fixedly mounted on the second movable stage;
- a second detecting step for moving the first movable stage in a scan exposure direction and for detecting a relative positional relationship between the predetermined alignment mark of the second reference plate and a second alignment mark of the first reference plate which second alignment mark is disposed in the scan exposure direction, with respect to the first alignment mark; and
- a determining step for determining a scan direction of one of the first and second movable stages on the basis of the detection at said first and second detecting steps.

11. A device manufacturing method wherein a first movable stage being movable while carrying a mask thereon and a second movable stage being movable while carrying a wafer thereon are scanned in a timed relation and relative to a projection optical system and wherein a pattern of the mask is projected and printed onto the wafer through the projection optical system, from which wafer devices are manufactured, said method comprising:
- a first detecting step for detecting a relative positional relationship between a first alignment mark of a first reference plate fixedly mounted on the first movable stage and a predetermined alignment mark of a second reference plate fixedly mounted on a holding member for holding the projection optical system;
- a second detecting step for moving the first movable stage in a scan exposure direction and for detecting a relative positional relationship between the predetermined alignment mark of the second reference plate and a second alignment mark of the first reference plate which second alignment mark is disposed in the scan exposure direction, with respect to the first alignment mark; and
- a determining step for determining a scan direction of one of the first and second movable stages on the basis of the detection at said first and second detecting steps.

12. A scanning exposure method usable with a first movable stage being movable while carrying a first object thereon, a second movable stage being movable while carrying a second object thereon, a first reference plate fixedly mounted on the first movable stage and having plural alignment marks formed thereon, and a second reference plate fixedly mounted on the second movable stage and having plural alignment marks formed thereon, wherein the first and second movable stages are scanned in a timed relation and relative to a projection optical system, and wherein a pattern of the first object is projected onto the second object through the projection optical system, said method comprising:
- a first detecting step for detecting a relative positional relationship between alignment marks of the first reference plate and alignment marks of the second reference plate through the projection optical system to detect a relationship between a coordinate system as determined by plural alignment marks of the first reference plate and a coordinate system as determined by plural alignment marks of the second reference plate;
- a second detecting step for moving the first movable stage in a scan exposure direction to detect a relative positional relationship between alignment marks of the first reference plate and alignment marks of the second reference plate, and for detecting a relationship between a coordinate system as determined by alignment marks of the first reference plate and a coordinate system as determined by an actual scan direction of the first movable stage;
- a third detecting step for detecting a relative positional relationship between alignment marks of the first object and alignment marks of the first reference plate, and for detecting a relationship between a coordinate system as determined by alignment marks of the first reference plate and a coordinate system as determined by alignment marks of the first object; and
- a correcting step for correcting the scan direction of the first movable stage, on the basis of the detection at said first, second and third detecting steps.

13. A method according to claim 12, further comprising a correcting step for correcting the scan direction of the first movable stage on the basis of the detection at said fourth detecting step.

14. A scanning exposure method usable with a first movable stage being movable while carrying a first object thereon, a second movable stage being movable while carrying a second object thereon, a first reference plate fixedly mounted on the first movable stage and having plural alignment marks formed thereon, and a second reference plate fixedly mounted on the second movable stage and having plural alignment marks formed thereon, wherein the first and second movable stages are scanned in a timed relation and relative to a projection optical system, and wherein a pattern of the first object is projected onto the second object through the projection optical system, said method comprising:

- a first detecting step for detecting a relative positional relationship between alignment marks of the first reference plate and alignment marks of the second reference plate through the projection optical system to detect a relationship between a coordinate system as determined by plural alignment marks of the first reference plate and a coordinate system as determined by plural alignment marks of the second reference plate;
- a second detecting step for moving the first movable stage in a scan exposure direction to detect a relative positional relationship between alignment marks of the first reference plate and alignment marks of the second reference plate, and for detecting a relationship between a coordinate system as determined by alignment marks of the first reference plate and a coordinate system as determined by an actual scan direction of the first movable stage;
- a third detecting step for detecting a relative positional relationship between alignment marks of the first reference plate and alignment marks of a third reference plate fixedly mounted on a holding member for holding the projection optical system, and for detecting a relationship between a coordinate system as determined by alignment marks of the first reference plate and a coordinate system as determined by alignment marks of the third reference plate;
- a fourth detecting step for detecting a relative positional relationship between alignment marks of the first object and alignment marks of the third reference plate, and for detecting a relationship between a coordinate system as determined by alignment marks of the first reference plate and a coordinate system as determined by alignment marks of the third reference plate; and
- a correcting step for correcting the scan direction of the first movable stage, on the basis of the detection at said first, second, third and fourth detecting steps.

15. A method according to claim 14, further comprising a correcting step for correcting the scan direction of the first movable state on the basis of the detection at said sixth detecting step.

16. A method according to claim 12, further comprising a correcting step for correcting a scan direction of at least one of the first and second movable stages on the basis of the relationship between the actual movement direction of the first movable stage and the actual movement direction of the second movable stage.

17. A device manufacturing method usable with a first movable stage being movable while carrying a mask thereon, a second movable stage being movable while carrying a wafer thereon, a first reference plate fixedly mounted on the first movable stage and having plural alignment marks formed thereon, and a second reference plate fixedly mounted on the second movable stage and having plural alignment marks formed thereon, wherein the first and second movable stages are scanned in a timed relation and relative to a projection optical system, and wherein a pattern of the mask is projected onto the wafer through the projection optical system, from which wafer devices are manufactured, said method comprising:

- a first detecting step for detecting a relative positional relationship between alignment marks of the first reference plate and alignment marks of the second reference plate through the projection optical system to detect a relationship between a coordinate system as determined by plural alignment marks of the first reference plate and a coordinate system as determined by plural alignment marks of the second reference plate;
- a second detecting step for moving the first movable stage in a scan exposure direction to detect positions of alignment marks of the first reference plate and for detecting a relationship between a coordinate system as determined by alignment marks of the second reference plate and a coordinate system as determined by an actual scan direction of the first movable stage;
- a third detecting step for moving the second movable stage in a scan exposure direction to detect positions of alignment marks of the second reference plate and for detecting a relationship between a coordinate system as determined by alignment marks of the second reference plate and a coordinate system as determined by an actual scan direction of the second movable stage; and
- a determining step for determining a relationship between the actual scan direction of the first movable stage and the actual scan direction of the second movable stage on the basis of the detection at said first, second and third detecting steps.

18. A scanning exposure apparatus, comprising:

- a first movable stage being movable while carrying a first object thereon;
- a second movable stage being movable while carrying a second object thereon;
- an illumination optical system for illuminating the first object with exposure light;
- a projection optical system for projecting a pattern of the first object as illuminated by said illumination optical system;
- control means serviceable to scan said first and second movable stages in a timed relation and relative to said projection optical system and to project the pattern of the first object onto the second object through said projection optical system;
- first detecting means for detecting a relative positional relationship between an alignment mark of a first reference plate fixedly mounted on said first movable stage and an alignment mark of a second reference plate fixedly mounted on said second movable stage;
- second detecting means for detecting a position of said second reference plate in cooperation with said projection optical system; and
- third detecting means for detecting a measurement error in the detection of a position of the second object through said second detecting means, on the basis of the detection by said first and second detecting means.

19. An apparatus according to claim 18, wherein said first detecting means uses measurement light having a wavelength substantially the same as that of the exposure light.

20. An apparatus according to claim 18 wherein said second detecting means uses measurement light having a wave length substantially the same as that of the exposure light.

21. An apparatus according to claims 18 wherein all the detecting means and the alignment marks are so arranged that, when said first detecting means detects the relative positional relationship between the first and second reference plates, said second detecting means measures a position of the second reference plate without moving said first and second movable stages.

22. A scanning exposure method usable with a first movable stage being movable while carrying a first object thereon, a second movable stage being movable while carrying a second object thereon, an illumination optical system for illuminating the first object with exposure light, and a projection optical system for projecting a pattern of the first object illuminated by the illumination optical system onto the second object, wherein the first and second movable stages are scanned in a timed relation and relative to the projection optical system, and wherein the pattern of the first object is projected onto the second object through the projection optical system, said method comprising:

a first detecting step for detecting a relative positional relationship between an alignment mark of a first reference plate fixedly mounted on the first movable stage and an alignment mark of a second reference plate fixedly mounted on the second movable stage;

a second detecting step for detecting a position of the second reference plate through the projection optical system; and a third detecting step for detecting a measurement error in the detection of the position of the second object by the second detecting step, on the basis of the detection at said first and second detecting steps.

23. A method according to claim 22, wherein said first detecting step uses measurement light having a wavelength substantially the same as that of the exposure light.

24. A method according to claim 22, wherein said second detecting step uses measurement light having a wavelength substantially the same as that of the exposure light.

25. A method according to claim 22 wherein, when the relative positional relationship between the first and second reference plates is detected at said first detecting step, a position of the second reference plate is measured without moving the first and second movable stages.

26. A device manufacturing method usable with a first movable stage being movable while carrying a mask thereon, a second movable stage being movable while carrying a wafer thereon, an illumination optical system for illuminating the mask with exposure light, and a projection optical system for projecting a pattern of the mask illuminated by the illumination optical system onto the wafer, wherein the first and second movable stages are scanned in a timed relation and relative to the projection optical system, and wherein the pattern of the mask is projected onto the wafer through the projection optical system, from which wafer devices are manufactured, said method comprising:

a first detecting step for detecting a relative positional relationship between an alignment mark of a first reference plate fixedly mounted on the first movable stage and an alignment mark of a second reference plate fixedly mounted on the second movable stage;

a second detecting step for detecting a position of the second reference plate through the projection optical system; and a third detecting step for detecting a measurement error in the detection of a position of the wafer through the projection optical system, on the basis of the detection at said first and second detecting steps.

27. A scanning exposure apparatus, comprising:

a first movable stage being movable while carrying a first object thereon;

a second movable stage being movable while carrying a second object thereon;

a projection optical system for projecting a pattern;

a first reference plate fixedly mounted on said first movable stage;

a second reference plate fixedly mounted on said second movable stage;

first detecting means for detecting a first relative positional relationship between a first alignment mark of said first reference plate and an alignment mark of said second reference plate, said first detecting means further being operable to move said first movable stage in a scan exposure direction and to detect a second relative positional relationship between an alignment mark of the second reference plate and a second alignment mark of the first reference plate which second alignment mark is disposed in the scan exposure direction with respect to the first alignment mark;

second detecting means for detecting a third relative positional relationship between an alignment mark of the first object and at least one of the first and second alignment marks of the first reference plate; and control means for aligning a scan direction of the first object with a scan direction of the first movable stage, on the basis of the detection of said first, second and third relative positional relationships, said control means further being operable to cause said first and second movable stages to be scanned in a timed relation and relatively to said projection optical system so that a pattern of the first object is projected on to the second object through said projection optical system.

28. A scanning exposure apparatus, comprising:

a first movable stage being movable while carrying a first object thereon;

a second movable stage being movable while carrying a second object thereon;

a projection optical system for projecting a pattern;

a first reference plate fixedly mounted on said first movable stage;

a second reference plate fixedly mounted on said second movable stage;

first detecting means for detecting a relative positional relationship between alignment marks of the first reference plate and alignment marks of the second reference plate, through the projection optical system, and for detecting first relationship between a coordinate system as determined by plural alignment marks of the first reference plate and a coordinate system as determined by plural alignment marks of the second reference plate, said first detecting means further being operable to move the first movable stage in a scan exposure direction and to detect positions of alignment marks of the first reference plate to detect a second relationship between a coordinate system as determined by alignment marks of the second reference plate and a coordinate system as determined by an actual scan direction of the first movable stage;

second detecting means for detecting a relative positional relationship between alignment marks of the first object and alignment marks of the first reference plate, and for detecting a third relationship between a coordinate system as determined by alignment marks of the first reference plate and a coordinate system as determined by alignment marks of the first object;

control means for correcting the scan direction of the first movable stage, on the basis of the detection of the first, second and third relationships, and for causing said first and second movable stages to be scanned in a timed relation and relatively to said projection optical system, so that the pattern of the first object is projected on to the second object through said projection optical system.

29. A scanning exposure apparatus, comprising:

a first movable stage being movable while carrying a first object thereon;

a second movable stage being movable while carrying a second object thereon;

a projection optical system for projecting a pattern;

a first reference plate fixedly mounted on said first movable stage;

a second reference plate fixedly mounted on said second movable stage;

first detecting means for detecting a relative positional relationship between alignment marks of the first reference plate and alignment marks of the second reference plate, through the projection optical system, and for detecting a first relationship between a coordinate system as determined by plural alignment marks of the first reference plate and a coordinate system as determined by plural alignment marks of the second reference plate, said first detecting means further being operable to move the first movable stage in a scan exposure direction and to detect positions of alignment marks of the first reference plate to detect a second relationship between a coordinate system as determined by alignment marks of the second reference plate and a coordinate system as determined by an actual scan direction of the first movable stage;

second detecting means for detecting a relative positional relationship between alignment marks of the first reference plate and alignment marks of a third reference plate fixedly mounted on a holding member for holding said projection optical system, and for detecting a third relationship between a coordinate system as determined by alignment marks of the first reference plate and a coordinate system as determined by alignment marks of the third reference plate, said second detecting means further being operable to detect a relative positional relationship between alignment marks of the first object and alignment marks of said third reference plate, and to detect a fourth relationship between a coordinate system as determined by alignment marks of the first reference plate and alignment marks of the third reference plate; and control means for correcting the scan direction of the first movable stage, on the basis of the detection of the first, second and third relationships, and for causing said first and second movable stages to be scanned in a timed relation and relatively to said projection optical system, so that the pattern of the first object is projected onto the second object through said projection optical system.

* * * * *

UNITED STATES PATENT AND TRADEMARK OFFICE
CERTIFICATE OF CORRECTION

PATENT NO. : 5,751,404

DATED : May 12, 1998

INVENTOR(S) : EIICHI MURAKAMI, ET AL.

It is certified that error appears in the above-identified patent and that said Letters Patent is hereby corrected as shown below:

COLUMN 5:

line 38, "no" should read --on--; and
    line 53, "comprises" should read --comprise--.

COLUMN 8:

line 6, "is a schematic" should be deleted;
    line 7, "view" should be deleted;
    line 19, "is a schematic" should be deleted;
    line 20, "view" should be deleted;
    line 33, "plated" should read --plate--;
    line 41, "is a schematic" should be deleted; and
    line 42, "view" should be deleted.

COLUMN 14:

line 17, "wafer reference plate 12" should read --mask reference plate 10--.

UNITED STATES PATENT AND TRADEMARK OFFICE
CERTIFICATE OF CORRECTION

PATENT NO. : 5,751,404

DATED : May 12, 1998

INVENTOR(S) : EIICHI MURAKAMI, ET AL.

It is certified that error appears in the above-identified patent and that said Letters Patent is hereby corrected as shown below:

COLUMN 19:

line 32, "wafer 4" should read --wafer 3--.

COLUMN 20:

line 58, "dose" should read --does--.

COLUMN 25:

line 46, "stage,on" should read --stage, on--.

COLUMN 26:

line 64, "claim 18" should read --claim 18,--.

COLUMN 27:

line 1, "claim 18" should read --claim 18,--; and
    line 38, "Claim 22" should read --claim 22,--.

UNITED STATES PATENT AND TRADEMARK OFFICE
CERTIFICATE OF CORRECTION

PATENT NO. : 5,751,404

DATED : May 12, 1998

INVENTOR(S) : EIICHI MURAKAMI, ET AL.

It is certified that error appears in the above-identified patent and that said Letters Patent is hereby corrected as shown below:

COLUMN 28:

line 51, "first" should read --a first--.

COLUMN 29:

line 9, "on to" should read --onto--.

Signed and Sealed this

Twenty-ninth Day of December, 1998

Attest:

BRUCE LEHMAN

Attesting Officer

Commissioner of Patents and Trademarks